(12) United States Patent
Kitamura

(10) Patent No.: US 6,435,869 B2
(45) Date of Patent: Aug. 20, 2002

(54) QUARTZ WINDOW HAVING REINFORCING RIBS

(75) Inventor: Masayuki Kitamura, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/839,157

(22) Filed: Apr. 23, 2001

(30) Foreign Application Priority Data

Apr. 21, 2000 (JP) ........................................ 2000-121575

(51) Int. Cl.[7] ................................................. F27D 5/00

(52) U.S. Cl. ........................ 432/253; 219/405; 392/416; 118/715; 118/725

(58) Field of Search .......................... 432/253; 219/390, 219/405, 411; 118/715, 725; 392/416, 418

(56) References Cited

U.S. PATENT DOCUMENTS

| 5,648,005 | A | * | 7/1997 | Cobb et al. | .................. 219/405 |
| 6,127,658 | A | * | 10/2000 | Kohav | .......................... 392/416 |
| 6,300,601 | B1 | * | 10/2001 | Suzuki | ........................ 219/390 |
| 6,350,964 | B1 | * | 2/2002 | Boas et al. | .................. 219/390 |

* cited by examiner

Primary Examiner—Gregory Wilson
(74) Attorney, Agent, or Firm—Pillsbury Winthrop LLP

(57) ABSTRACT

A quartz window can withstand a pressure difference between an atmospheric pressure and a negative pressure environment created in a thermal processing apparatus that applies a thermal process to a target object under the negative pressure environment. The quartz window is adapted to be positioned between a radiation heat source and an object to be subjected to a heat treatment in the process chamber. The quartz window has a plate made of quartz and a plurality of ribs formed on the plate so as to reinforce the plate.

18 Claims, 14 Drawing Sheets

QUARTZ WINDOW HAVING REINFORCING RIBS

BACKGROUND OF THE INVENTION

1. Field of the Invention

The present invention relates to a window attached to a process chamber and, more particularly, to a quartz window attached to a process chamber for applying a thermal process to a substrate placed inside the process chamber by applying a heat through the quartz window.

The present invention is especially suitable for a window provided to a rapid thermal processing (RTP) apparatus, which is preferably used for a manufacturing process of semiconductor devices such as a memory device or an integrated circuit (IC). The RTP includes a rapid thermal annealing (RTA), a rapid thermal cleaning (RTC), a rapid thermal chemical vapor deposition (RTCVD), a rapid thermal oxidation (RTO), a rapid thermal nitriding (RTN), etc.

2. Description of the Related Art

Generally, in a manufacturing process of a semiconductor integrated circuit, a semiconductor substrate such as a silicon wafer is repeatedly subject to various thermal processes or heat treatment processes. The thermal processes may include a film deposition process, an annealing process, an oxidation diffusion process, a sputtering process, an etching process, a nitriding process, etc.

In order to improve a yield rate and a quality of semiconductor products, the RTP technique, which rapidly increases and decreases a temperature of an object to be processed, has attracted a great attention. A conventional RTP apparatus generally comprises: a single-wafer process chamber in which an object to be processed, such as a semiconductor wafer, a glass substrate for photo-masking, a glass substrate for liquid-crystal display or a substrate for an optical disk, is placed; a quartz-glass window attached to the process chamber; a heating lamp such as a halogen lamp; and a reflector provided on an opposite side of the object to be processed with respect to the heating lamp. Hereinafter, the object to be processed may be referred to as a target object.

The quartz-glass window is formed in a platelike shape or in a tubular shape in which the target object can be accommodated. When gasses inside the process chamber are evacuated by a vacuum pump and a negative pressure environment is maintained in the process chamber, the quartz window has a thickness of about 30 mm to 40 mm so as to withstand with a pressure difference between inside the process chamber and an atmospheric pressure. The quartz-glass window may have a concave shape so that the center thereof is apart from the process space inside the process chamber since the quartz window tends to be bent toward the processing space due to a temperature increase.

A plurality of halogen lamps is arranged so as to evenly heat the target object, and the reflector uniformly reflects an infrared light toward the target object. The process chamber is typically provided with a gate valve on a sidewall thereof so as to let the target object transported therethrough. Additionally, a gas supply nozzle is connected to the sidewall of the process chamber so as to introduce a process gas used for a thermal processing.

Since the temperature of the target object influences a quality of the process (for example, a thickness of a deposited film in a film deposition process), the temperature must be accurately detected. In order to achieve a rapid temperature increase or decrease, a temperature-measuring device is provided in the process chamber so as to measure the temperature of the target object. The temperature-measuring device may be comprised of a thermocouple. However, the thermocouple may contaminate the target object due to a metal constituting the thermocouple since the thermocouple must be brought into contact with the target object.

Accordingly, a pyrometer has been suggested, such as disclosed in Japanese Laid-Open Patent Application No. 11-258051, as a temperature-measuring device for measuring a temperature of the target object. The pyrometer calculates a temperature of the target object by converting an emissivity $\epsilon$ into a temperature, the emissivity $\epsilon$ being calculated by the following equation (1) based on an intensity of radiation of infrared light radiated from a back surface of the target object.

$$E_m(T)=\epsilon E_{BB}(T) \tag{1}$$

In equation (1), $E_{BB}(T)$ represents an intensity of radiation from a black body having a temperature T, $E_m(T)$ represents an intensity of radiation from a target object, and $\epsilon$ represents an emissivity of the target object.

In operation, the target object is introduced into the process chamber through the gate valve, and supported by a holder on its periphery. During a thermal process, a process gas such as nitrogen or oxygen is introduced into the process chamber through gas supply nozzles. On the other hand, the target object absorbs an infrared light radiated by the halogen lamp, thereby increasing the temperature of the target object. An output of the halogen lamp is feedback-controlled in accordance with a result of measurement of the temperature-measuring device.

However, the conventional quartz window has a thickness as large as several millimeters, there are following problems. First, the light emitted by the lamp is absorbed by the quartz, which results in a decrease in an efficiency of irradiation of the target object. Second, The quartz window easily breaks due to a difference in thermal stress between front and back surfaces of the quartz window when a rapid temperature increase is performed such as in the RTP apparatus since a temperature difference is generated between the lamp facing surface and an opposite surface of the quartz window. Third, if the quartz window is bent, a distance between the lamp and the target object is increased, which deteriorates directivity of the irradiation by the lamp. Fourth, especially when a film deposition process is performed, a deposition film or a reaction by-product may deposit on the surface of the quartz window due to an increase in the temperature of the quartz window, which may deteriorate reproducibility of a process temperature and increase a frequency of cleaning operations of the process chamber. On the other hand, if the thickness of the process chamber is reduced, absorption of the light radiated from the lamp by the quartz window can be reduced.

However, there is a problem in that the quartz window is easily broken due to a difference between a negative pressure in the process chamber and an atmospheric pressure and, thereby, such a quartz window cannot applied to the process chamber in which a negative pressure environment is created.

SUMMARY OF THE INVENTION

It is a general object of the present invention to provide an improved and useful quartz window in which the above-mentioned problems are eliminated.

A more specific object of the present invention is to provide a quartz window, which can withstand a pressure difference between an atmospheric pressure and a negative pressure environment created in a thermal processing apparatus that applies a thermal process to a target object under the negative pressure environment.

Another object of the present invention is to provide a quartz window, which absorbs a relatively small amount of heat radiated from a heat source.

In order to achieve the above-mentioned objects, there is provided according to one aspect of the present invention a quartz window of a process chamber adapted to be positioned between a radiation heat source and an object to be subjected to a heat treatment in the process chamber, the quartz window comprising: a plate made of quartz; and a plurality of ribs formed on the plate so as to reinforce the plate.

According to the above-mentioned invention, the plate of the quartz window has a reduced thickness since the ribs reinforce the plate. Thus, the overall thickness of the quartz plate is reduced, which improves the directivity of heat supply by the radiation heat source to the object to be processed. Additionally, an amount of heat absorbed by the quartz window is reduced.

In the quartz window according to the present invention, the ribs may be made of quartz, and the ribs may be integrally formed with the plate. In one embodiment, the ribs may include a plurality of radial ribs extending in radial directions of the plate. The radial ribs may be symmetrically arranged with respect to the center of the plate. Additionally, the ribs may include a plurality of circumferential ribs extending in circumferential directions of the plate. The circumferential ribs may be concentrically arranged.

The plate of the quartz window preferably has a thickness equal to or smaller than 10 mm. Each of the ribs preferably has a thickness equal to or less than 10 mm and a height equal to or less than 15 mm.

The ribs may have openings to let air pass therethrough.

Additionally, there is provided according to another aspect of the present invention a thermal processing apparatus comprising: a process chamber in which an object to be processed is placed; an exhaust part connected to the process chamber so as to evacuate gas inside the process chamber; radiation heat sources which apply heat to the object placed in the process chamber; and a quartz window situated between the radiation heat source and the object, wherein the quartz window has a plurality of ribs formed on a quartz plate so as to reinforce the quartz plate.

According to the above-mentioned invention, the plate of the quartz window has a reduced thickness since the ribs reinforce the plate. Thus, the overall thickness of the quartz plate is reduced, which improves the directivity of heat supply by the radiation heat source to the object to be processed. Additionally, an amount of heat absorbed by the quartz window is reduced.

In the thermal processing apparatus according to the present invention, the ribs may be made of quartz, and the ribs may be integrally formed with the plate. In one embodiment, the ribs may include a plurality of radial ribs extending in radial directions of the plate, and the radial ribs may be symmetrically arranged with respect to the center of the plate. Additionally, the ribs may include a plurality of circumferential ribs extending in circumferential directions of the plate, and the circumferential ribs may be concentrically arranged.

Additionally, the thermal processing apparatus according to the present invention may further comprise a reflector which reflects a heat radiated from the radiation heat source toward the object through the quartz window, and the reflector has accommodating parts accommodating the radiation heat source and a plurality of extending parts extending toward the plate of the quartz window, the extending parts being engaged with the respective ribs of the quartz window.

Since the reflector has grooves that receive the respective ribs of the quartz window, the overall thickness of the structure including the quartz window and the reflector is reduced, which reduced a distance between the radiation heat source and the object to be processed. Additionally, the ribs of the quartz window engage with the inner walls of the grooves when the quartz window is bent due to a pressure difference caused by a vacuum created in the process chamber. Thereby, the quartz window is prevented from being further deformed, which further reduces the thickness of the quartz window.

In one embodiment, each of the extending parts may have a groove which receives a respective one of the ribs of the quartz window. Each of the ribs may protrude into a respective one of the accommodating parts so that each of the extending parts of the reflector is positioned between adjacent ones of the ribs.

Other objects, features and advantages of the present invention will become more apparent from the following detailed description when read in conjunction with the accompanying drawings.

DETAILED DESCRIPTION OF THE PREFERRED EMBODIMENT

Figure 1:
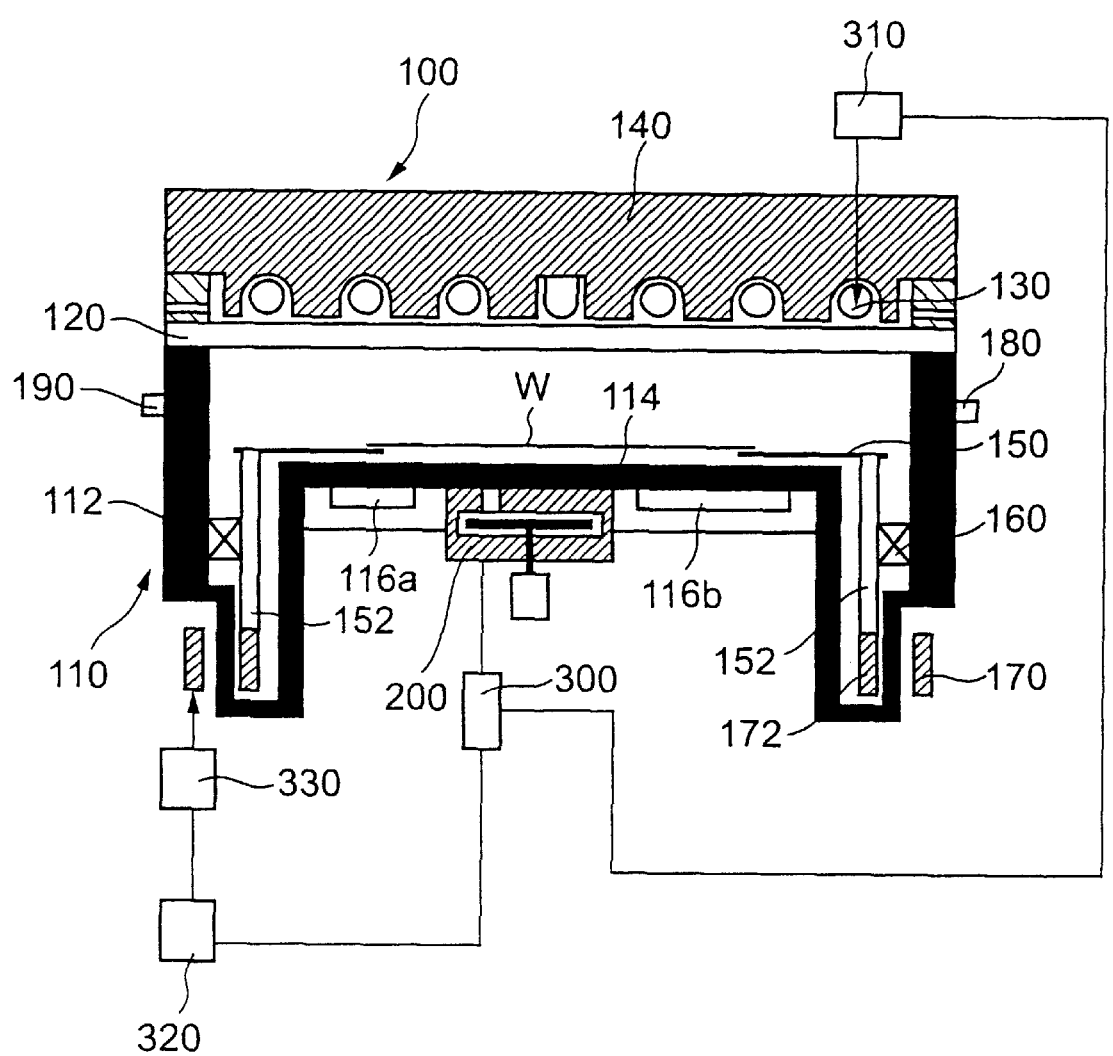
FIG. 1 is an illustrative cross-sectional view of a thermal processing apparatus according to an embodiment of the present invention.

A description will now be given, with respect to FIG. 1, of a thermal processing apparatus 100 according to an embodiment of the present invention. FIG. 1 is an illustrative cross-sectional view of the thermal processing apparatus 100 according to an embodiment of the present invention.

As shown in FIG. 1, the thermal processing apparatus comprises a process chamber 110, a quartz window 120, a heating lamp 130, a reflector 140, a support ring 150, a bearing 160, a permanent magnet 170, a gas introducing part 180, an exhaust part 190, a radiation thermometer 200 and a control unit 300.

The process chamber 110 is formed of stainless steel or aluminum, and is connected with the quartz window 120. A sidewall 112 of the process chamber 110 and the quartz window 120 together define a process space for applying a thermal process to a target object W. A support ring 150 and a support part connected to the support ring are situated in the process space. The target object W such as a semiconductor wafer is placed on the support ring 150. The gas introducing part 180 and the exhaust part 190 are connected to the sidewall 112 of the process chamber 110. The process space is maintained at a negative pressure environment by being evacuated through the exhaust part 190. It should be noted that a gate valve through which the target object W is transported is omitted in FIG. 1.

A bottom part 114 of the process chamber 110 is connected to cooling pipes 116a and 116b (hereinafter, simply referred to as cooling pipe 116) so that the bottom part 114 can serve as a cooling plate. If necessary, a temperature control arrangement may be provided to the cooling plate 114. The temperature control arrangement may comprise a control unit 300, a temperature sensor and a heater, and cooling water is supplied thereto from a water source such as a water line. Instead of cooling water, other kinds of coolant such as alcohol, gulden or chlorofluorocarbon may be used. As for the temperature, a known sensor such as a PTC thermistor, an infrared sensor or a thermocouple can-be used. The heater may be a heater wire wound on a periphery of the cooling pipe 116 so that a temperature of water flowing through the cooling pipe 116 is adjusted by controlling a current supplied to the heater wire.

Figure 2:
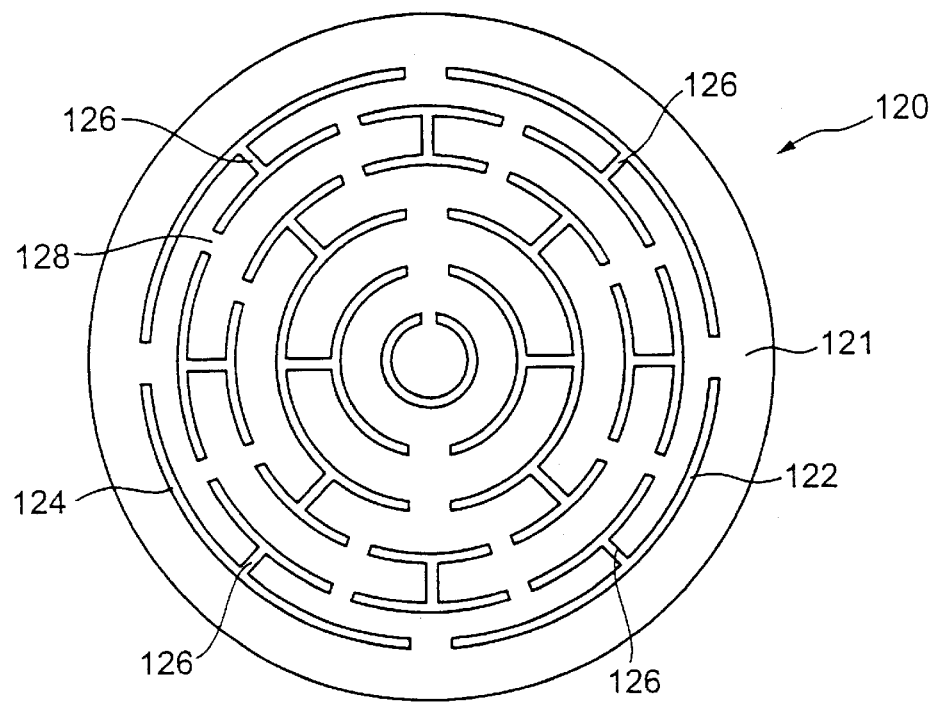
FIG. 2 is a plan view of a quartz window shown in FIG. 1.
Figure 3:
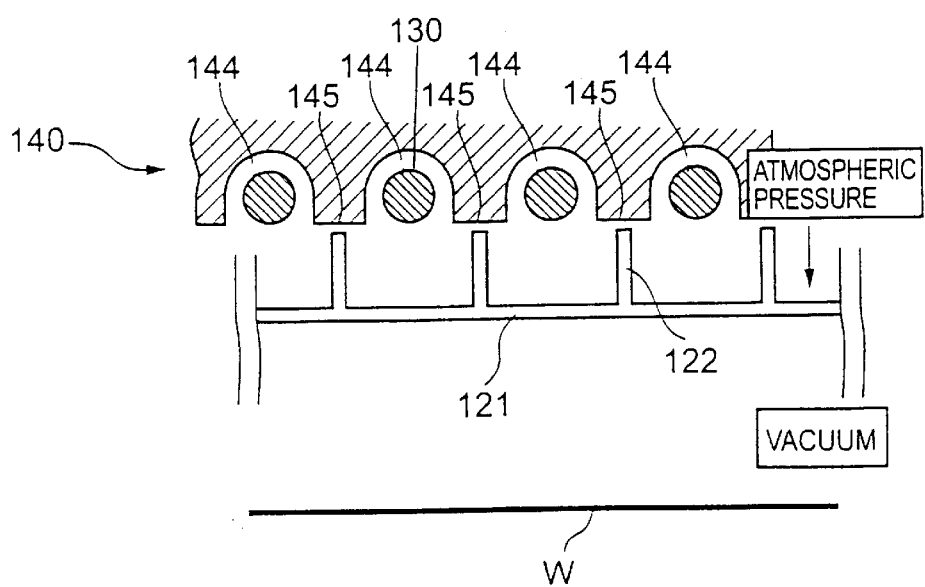
FIG. 3 is an enlarged cross-sectional view of the quartz window.

The quartz window 120 is mounted to the process chamber 110 in airtight manner so as to maintain the pressure difference between the negative pressure in the process chamber 110 and an atmosphere while transmitting a heat radiation light projected from the lamp 130. As shown in FIGS. 2 and 3, the quartz window 120 comprises a circular quartz plate 121 and ribs 122. The quartz plate 121 has a radius of about 400 mm and a thickness of about 2 mm to 6 mm. The thickness of the quartz plate is preferably equal to or less than 10 mm so as to reduce the overall thickness of the quartz window 120. FIG. 2 is a plan view of the quartz window 120. FIG. 3 is an enlarged cross-sectional view of the quartz window 120 with the lamps 130 and the reflector 140.

The ribs 122 include circumferential ribs 124 and radial ribs 126. Each of the circumferential ribs 124 extends in a circumferential direction so as to reinforce the quartz window 120 in the circumferential direction. Each of the radial ribs 126 extends in a radial direction so as to reinforce the quartz window 120 in the radial direction. Air passages 128 are formed at predetermined positions of the circumferential ribs 124 so as to supply cooling air for cooling the quartz window 120 and the lamps 130. The thickness of each of the circumferential ribs 124 and the radial ribs 126 is preferably equal to or less than 10 mm, and more preferably 2 mm to 6 mm. The height of each of the circumferential ribs 124 and the radial ribs 126 is preferably equal to or greater than 15 mm. Although the ribs 124 and 126 face the lamps 130 in the present embodiment, the ribs 124 and 126 may be provided on the side of quartz window 120 opposite to the lamps 130, or may be provided both sides of the quartz window 120.

Since the quartz plate 121 is reinforced by the ribs 122, the quartz plate 121 is not required to be bent in a direction away from the process chamber 110. That is, the quartz plate 121 can be a flat shape. As a result, the quartz plate 121 can be more easily produced than a conventional quartz plate. In the present embodiment, the ribs 122 are integrally formed with the quartz plate 121. However, the ribs 122 may be welded to the quartz plate 121.

As mentioned above, since the thickness of the quartz plate 121 is equal to or less than 10 mm and the height of the ribs 122 are also equal to or less than 10 mm, preferably 2 mm to 6 mm, the overall thickness of the quartz window 120 is less than the thickness of a conventional quartz window which is about several ten millimeters (about 30 mm to 40 mm). As a result, the quartz window 120 has an advantage over the conventional quartz window in that an amount of light projected by the lamps 130 absorbed by the quartz window 120 is small. Thus, the quartz window 120 has the following advantages.

First, rapid temperature increase can be achieved with a reduced power consumption since the irradiation efficiency of the light projected from the lamps 13 to the target object is improved. Second, the quartz window 120 is hardly broken since the temperature difference (that is, a difference in thermal stress) between the top and bottom surfaces thereof can be maintained less than that of the conventional quartz plate. This effect is also provided to the ribs 122. Third, a film or a by-product material is prevented from being deposited on the quartz window 120 since the temperature of the quartz window 120 is lower than the conventional quartz window. Accordingly, the temperature repeatability is maintained, and a frequency of cleaning operations for the process chamber 110 can be reduced.

Figure 4:
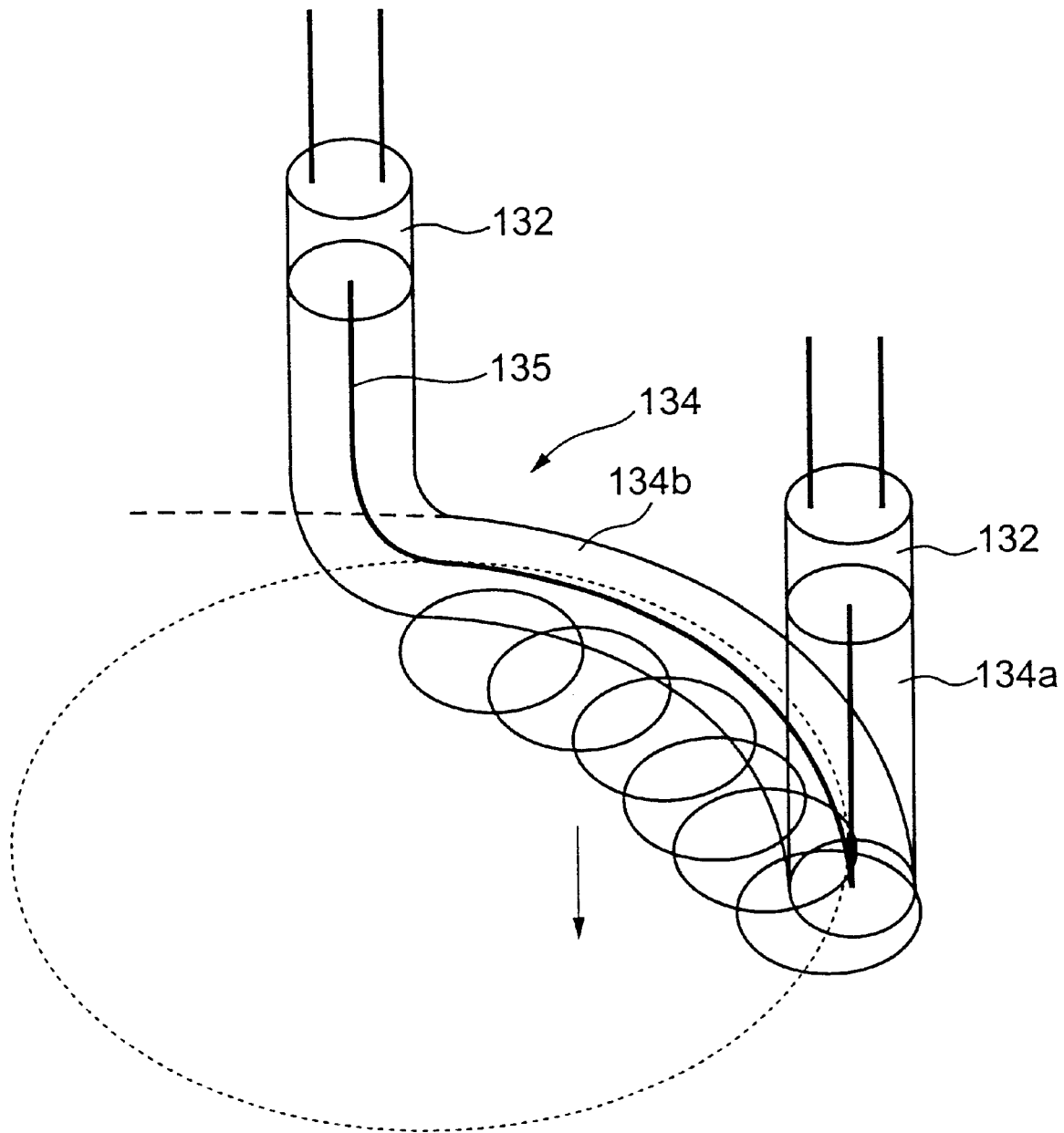
FIG. 4 is an illustration of a double end type lamp.

Each of the lamps 130 can be a double end type a single end type. The lamps 130 may be replaced by electric wire heaters or other heat radiating sources. FIG. 4 is an illustration of the double end type lamp 130 which has two opposite end electrodes 132. The single end type lamp has a shape similar to a light bulb having a single end electrode. The lamps 130 serve as a heat source for heating the target object. The lamps 130 can be halogen lamps in the present embodiment, but not limited to the halogen lamps. The output of each of the lamps 130 is determined by a lamp driver 310, which is controlled by the control unit 300, as described later, so as to supply an appropriate power to each of the lamps 130.

As shown in FIG. 4, each of the lamps 130 has the two opposite end electrodes 132 and a lamp house 134. The lamp house 134 has a filament connected to the two electrodes 132. The power supplied to the electrodes 132 is determined by the lamp driver 310 which is controlled by the control unit 300. A part between each of the electrodes 132 and the lamp driver 310 is sealed by a seal part 136 as described later.

As shown in FIG. 4, the lamp house 134 comprises an arc-like horizontal part 134*b* and two vertical part 134*a* extending from opposite ends of the horizontal part 134*b* in a direction perpendicular to the horizontal part 134*b*. The length of the horizontal part 134*b* is determined so that the horizontal part 134*b* can be accommodated between the adjacent circumferential ribs 124 forming concentric circles and between the radial ribs 126. However, each of the lamps 130 does not always completely cover the space between the adjacent radial ribs 126, and the lamps 130 can be arranged with a predetermined interval.

Accordingly, in the present embodiment, the lamps 130 are concentrically arranged in response to the circular target object W. When viewed along a circumferential direction of the quartz window 120, a plurality of lamps 130 each having an ark-like shape and having the same radius with respect to the center of the quartz window 120 are arranged. On the other hand, when viewed along a radial direction, a plurality of lamps 130 having different radiuses are arranged.

The present invention doe not excludes the use of a double end type lamp having a straight horizontal part. When such a double end type lamp having a straight horizontal part is used, the shapes of the ribs 122 may be changed so that the lamps can be accommodated. However, the lamps 130 according to the present embodiment is superior to the double end type lamp having a straight horizontal part since the double end type lamp having a straight horizontal part covers a wide area of the target object W and is positioned to traverse the surface of the target object W. That is, the double end type lamp having a straight horizontal part has a lower directivity, and is difficult to perform a control on an individual area basis. On the other hand, since the lamps 130 according to the present embodiment are arranged substantially in a concentric manner, the temperature control on an individual area basis can be easily achieved, thereby providing a good directivity. Thus, a direct projection onto the target object W can be efficiently performed.

The reflector 140 has a function to reflect the heart radiation light of the lamps 130. The reflector 140 has a plurality of vertical holes 142 into which the vertical parts 134 of the lamps 130 are inserted. Additionally, the reflector 140 has a plurality of concentrically arranged horizontal grooves 144 on the bottom thereof so as to accommodate the horizontal parts 134*b* of the lamps 130. A cooling pipe (not shown in the figure) is provided on or in the top portion of the reflector 140. As shown in FIG. 3, the reflector 140 has horizontal parts 145 that face the respective ribs 122 of the quartz window 120.

Figure 5:
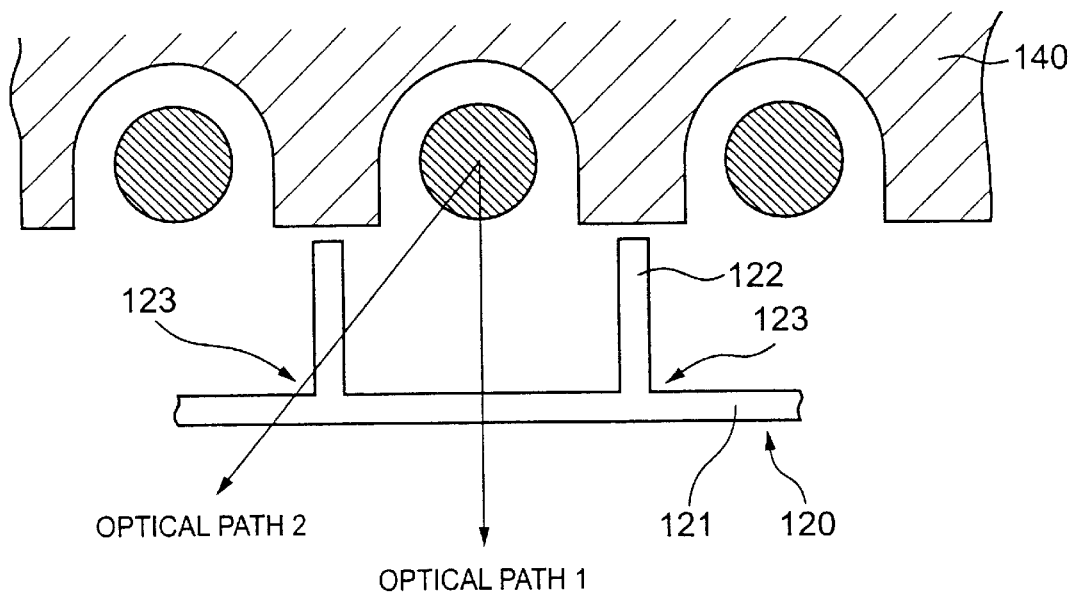
FIG. 5 is an illustrative cross-sectional view of a part of a reflector with the quartz window and lamps for explaining an influence of the light projected from the lamps.

FIG. 5 is an illustrative cross-sectional view of a part of the reflector 140 with the quartz window 120 and the lamps 130 for explaining an influence of the light projected from the lamps 130. According to the reflector 140, the length of an optical path 2 within the rib 122 is longer than the length of an optical path 1 within the quartz plate 121. Accordingly, the rib 122 absorbs more heat than the quartz plate 121. Thus, there is a difference in temperature between the quartz plate 121 and the ribs 122, and a crack may occur in a connecting portion 123 between the quartz plate 121 and the ribs 122 due to a difference in thermal expansion between the quartz plate 121 and the ribs 122. Such a problem may be solved by adjusting the thickness of the ribs 122. Alternatively, such a problem can be solved by using a reflector 140A shown in FIG. 6.

Figure 6:
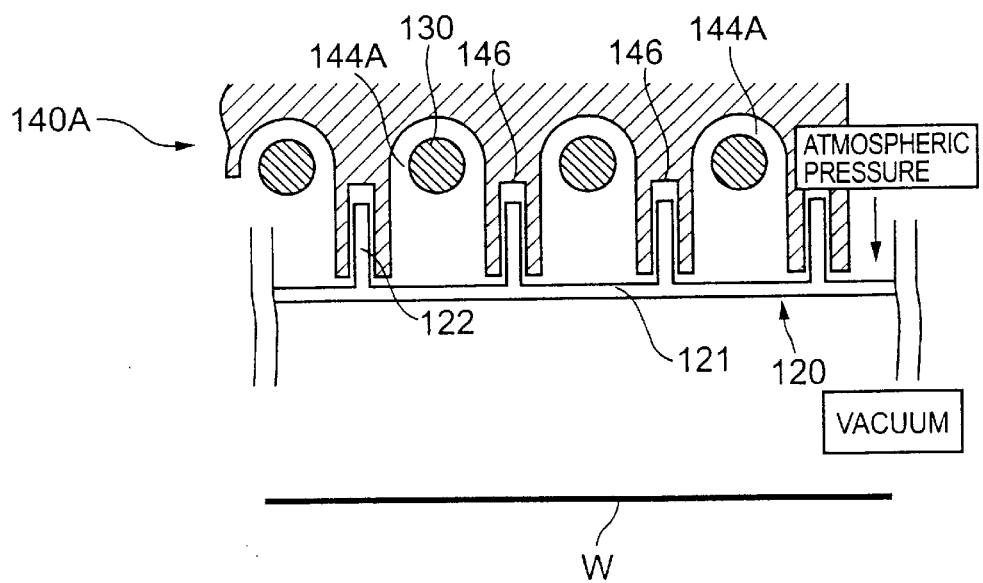
FIG. 6 is an enlarged cross-sectional view of a part of a reflector.
Figure 7:
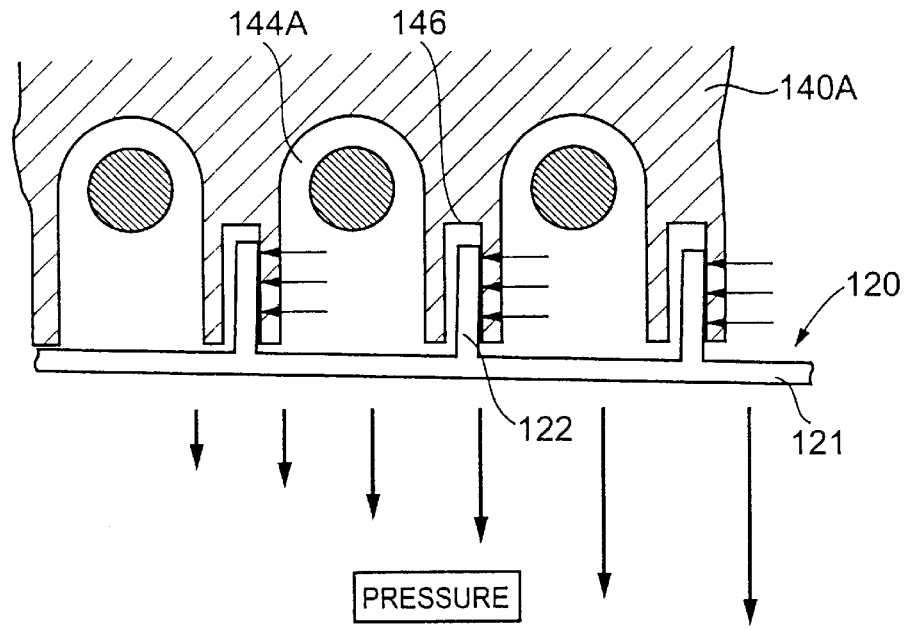
FIG. 7 is an enlarged cross-sectional view of the reflector shown in FIG. 6 with the quartz window being deformed by a pressure exerted thereon.

FIG. 6 is an enlarged cross-sectional view of a part of the reflector 140A. The reflector 140A is different from the reflector 140 in that the reflector 140A has grooves 144A, which are deeper than the grooves 144, thereby forming extending parts 147 that extend toward the quartz plate 121. A slit or groove 146 is formed in each of the extending parts 147 so as to accommodate a respective one of the ribs 122. According to the reflector 140A, the light projected from the lamps 130 is prevented from being directly incident on the ribs 122 since the ribs 122 are inserted into the respective grooves 146. Additionally, the structure of the reflector 140A has an advantage that the quartz window 120 is prevented from being deformed and broken due to an atmospheric pressure when a vacuum is formed in the process chamber 110 since the ribs 122 of the quartz window 120 are brought into contact with inner walls of grooves 146 when the quartz window 120 is deformed as shown in FIG. 7. FIG. 7 is an enlarged cross-sectional view of the reflector with the quartz window 120 being deformed by a pressure exerted on the quartz window 120. It should be noted that the reflector may have protrusions to support the ribs 122 so as to strengthen the quartz window 120.

Figure 8:
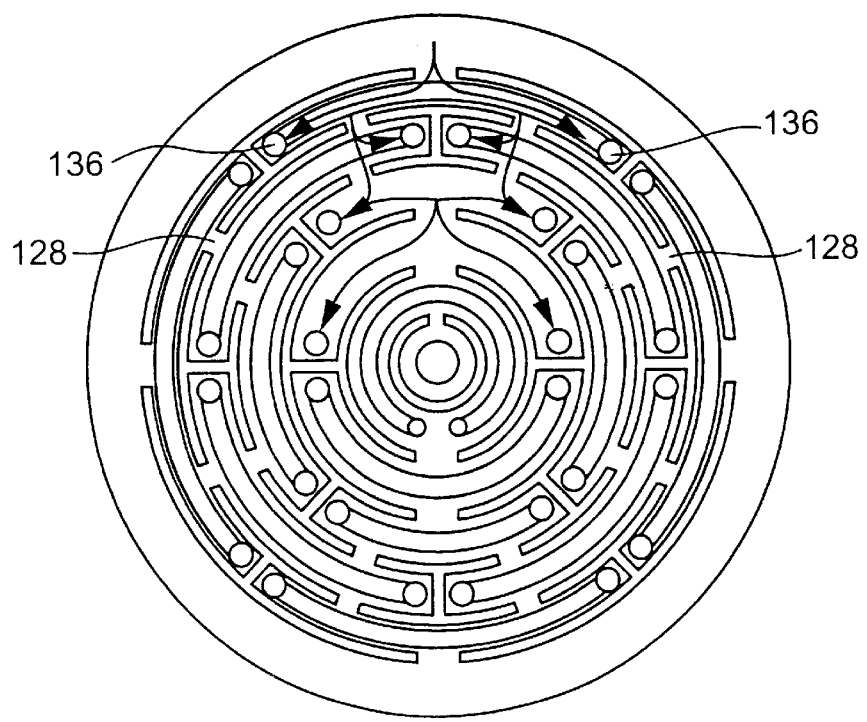
FIG. 8 is a plan view of the quartz window with lamps 130 arranged between ribs of the quartz window.
Figure 9:
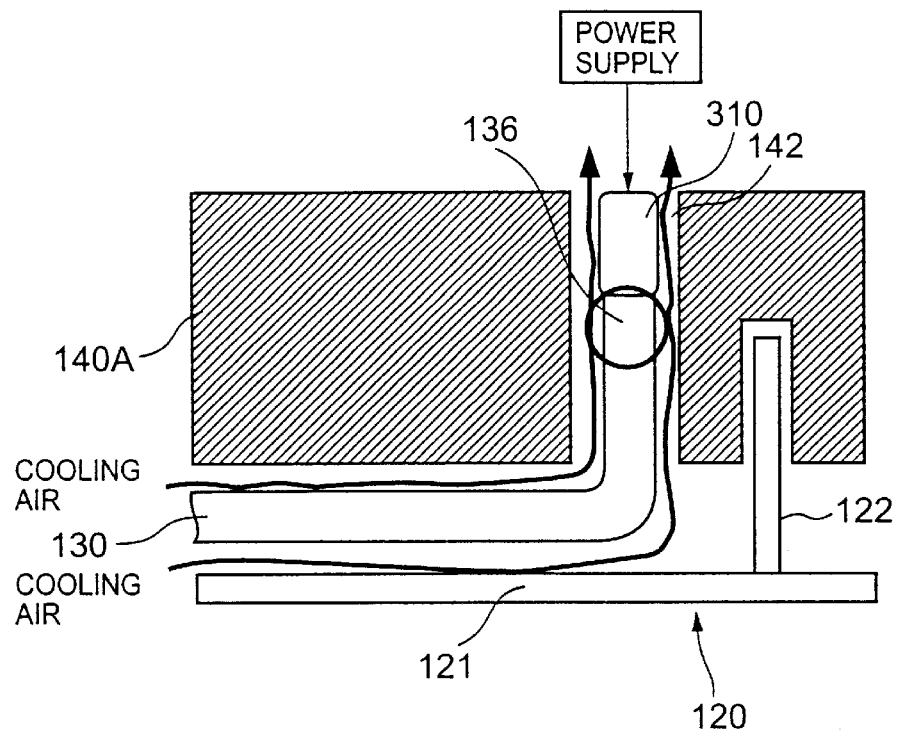
FIG. 9 is an enlarged cross-sectional view of a part of the structure shown in FIG. 8.

A description will now be given, with reference to FIGS. 8 and 9, of a relationship between the air passages 128 and the sealing parts 136. FIG. 8 is a plan view of the quartz window 120 with lamps 130 arranged between the ribs 122. FIG. 9 is an enlarged cross-sectional view of a part of the structure shown in FIG. 8.

Cooling air passes through the air passages 128 as shown in FIG. 8. Circles shown in FIG. 8 indicate positions of the sealing parts 136 of the lamps 130. An electric power is supplied to each of the lamps 130 through the electrode 132 and the sealing part 136 provided in the vertical part 134*a* of the lamp house 134. The electrode 132 and the sealing part 136 are positioned within a through hole 142 formed in the reflector 140A. The cooling air passes through the through hole 142 so as to effectively cool the sealing part 136. It should be noted that a cooling air introducing means is not indicated in FIG. 1.

In the present embodiment, the double end type lamps 130 may be replaced by single end type lamps as shown in FIGS.

Figure 10:
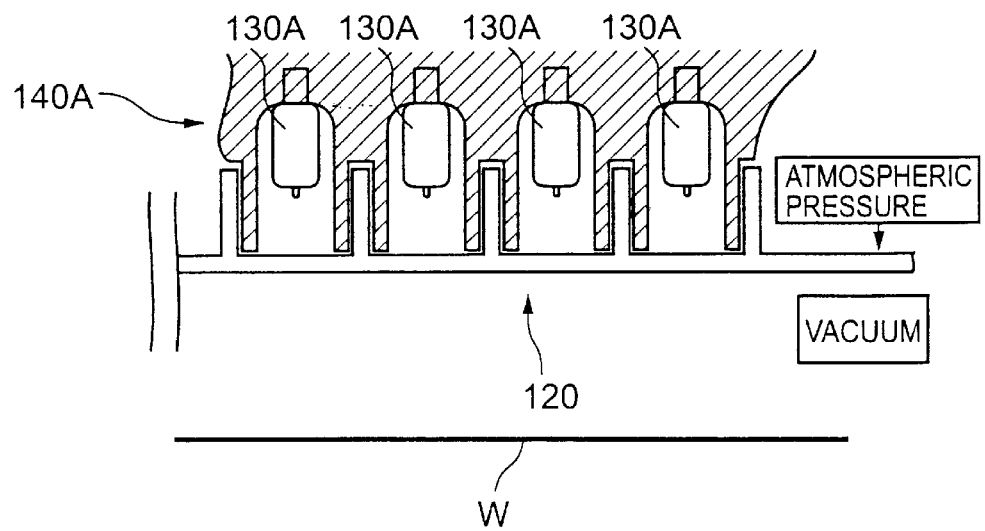
FIG. 10 is a cross-sectional view of a part of the reflector with the double end type lamps being replaced by single end type lamps.
Figure 11:
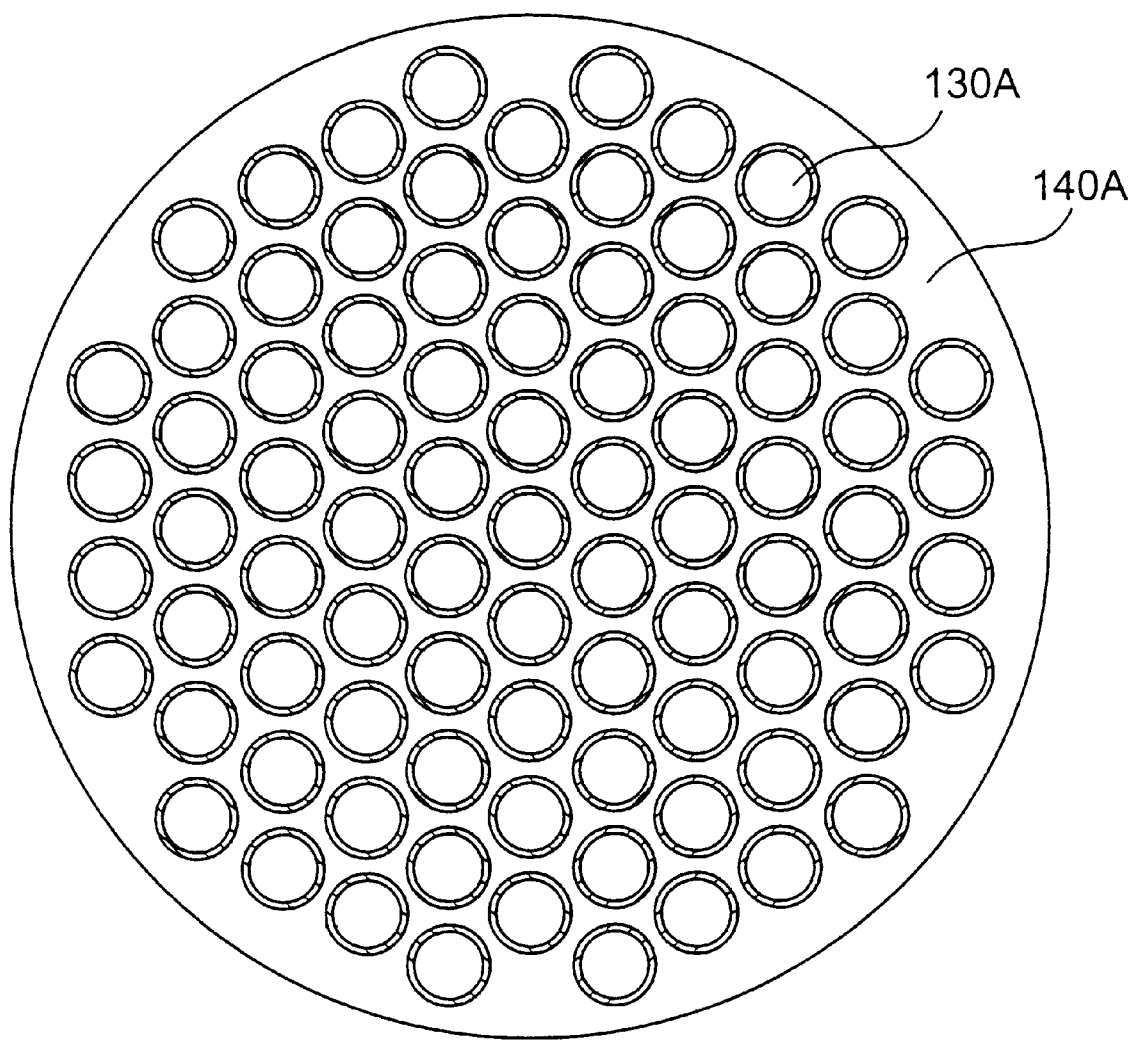
FIG. 11 is a plan view of the reflector with the double end type lamps being replaced by the single end type lamps.

10 and 11. FIG. 10 is a cross-sectional view of a part of the reflector 140A with the double end type lamps 130 being replaced by single end type lamps 130A. FIG. 11 is a plan view of the reflector 140A with the double end type lamps 130 being replaced by the single end type lamps 130A. The single end type lamps 130A provide a good directivity and controllability of the heat radiation light.

Figure 12:
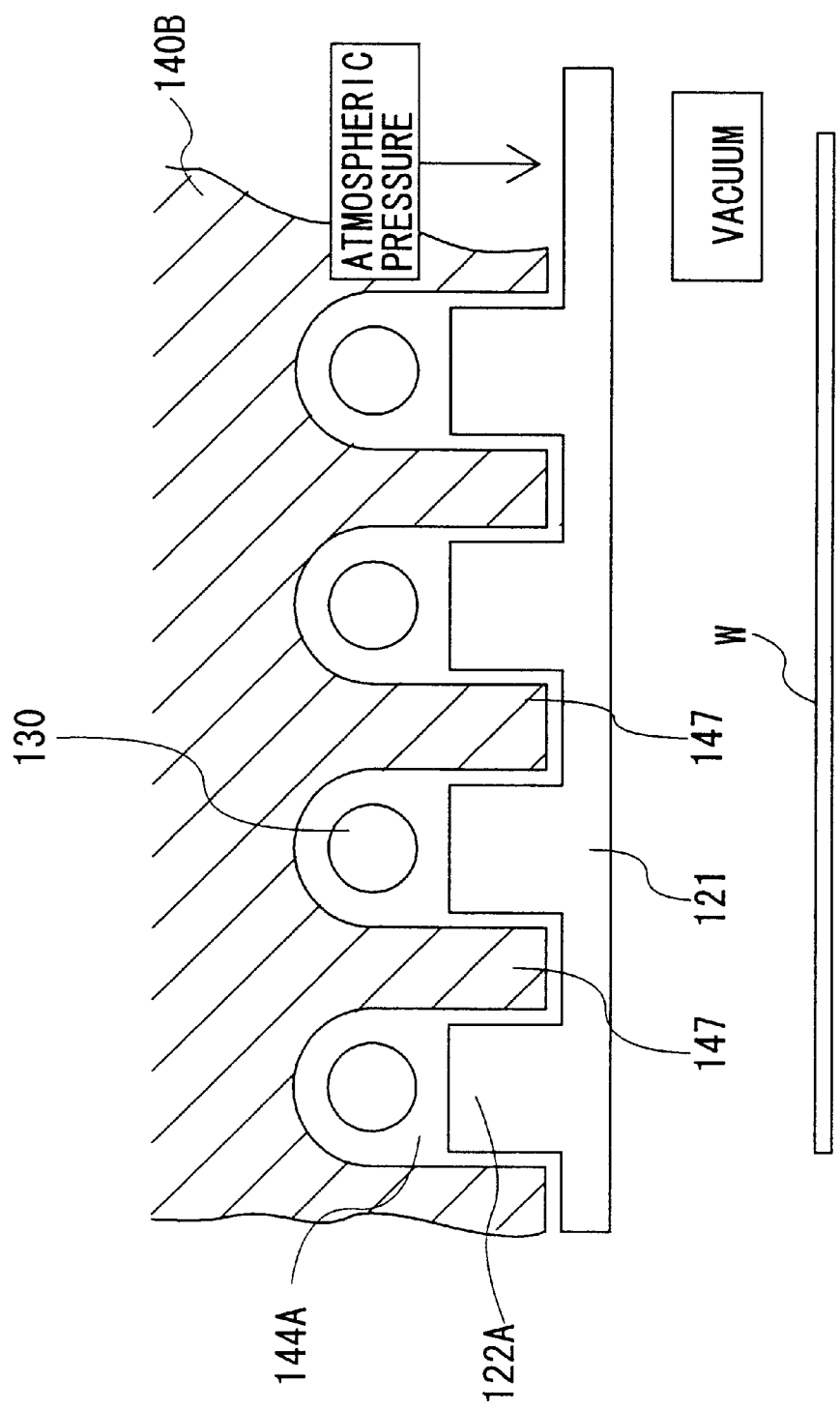
FIG. 12 is an enlarged cross-sectional view of a variation of the structure including a part of a quartz window and a part of a reflector shown in FIG. 6.

A description will now be given, with reference to FIG. 12, of a variation of the structure including the quartz window 120 and the reflector 140. FIG. 12 is an enlarged cross-sectional view of a structure including a part of a quartz window 120A and a part of a reflector 140B.

Similar to the reflector 140A, the reflector 140B has grooves 144A, which accommodate the respective lamps 130. The reflector 140A also has the extending parts 147 that extend toward the quartz plate 121 of the quartz window 120A.

Different from the ribs 122 of the quartz window 120, ribs 122A of the quartz window 120A protrude into the respective grooves 144A. Accordingly, each of the extending parts 147 of the reflector 140B is positioned between the adjacent ones of the ribs 122A.

Figure 13:
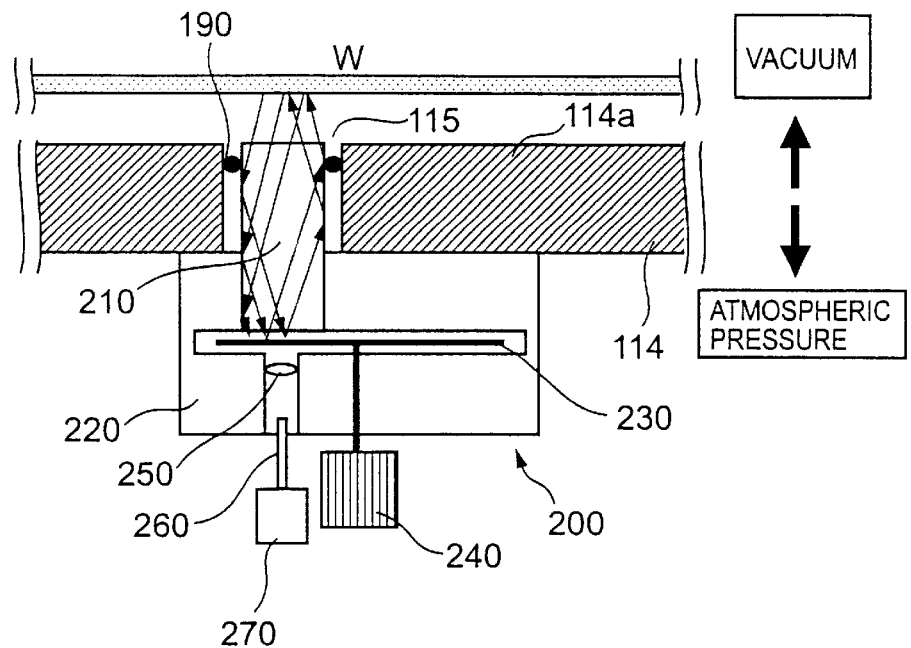
FIG. 13 is an enlarged cross-sectional view of a radiation thermometer shown in FIG. 1 and a part near the radiation thermometer.
Figure 14:
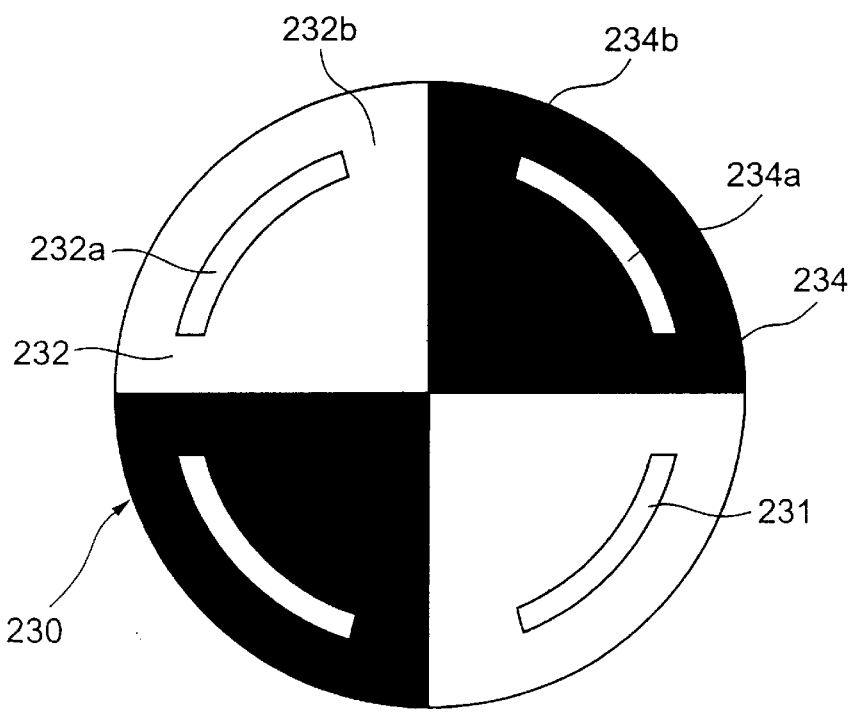
FIG. 14 is an illustrative plan view of a chopper of the radiation thermometer.

A description will now be given, with reference to FIGS. 13 and 14, of the radiation thermometer 200 shown in FIG. 1. FIG. 13 is an enlarged cross-sectional view of the radiation thermometer 200 and a part near the radiation thermometer 200. FIG. 14 is an illustrative plan view of a chopper 230 of the radiation thermometer 200. The radiation thermometer 200 is provided on the side opposite to the lamps 130 with respect to the target object W. The present invention does not exclude a structure in which the radiation thermometer 200 and the lamps 130 are provided on the same side with respect to the target object W. However, it is preferable that the light projected from the lamps 130 is prevented from being incident on the radiation thermometer 200.

The radiation thermometer 200 is mounted on a bottom part 114 of the process chamber 110. A surface 114a of the bottom part 114 of the process chamber 110 is provided with gold plating or the like so that the surface 114a serves as a reflecting surface (high-reflectance surface). If the surface 114a is a low-reflectance surface such as a black surface, the surface 144a absorbs heat radiated by the target object W, which renders an output of the lamps 130 being undesirably increased. The radiation thermometer 200 comprises a rod 210, a casing 220, a chopper or sector 230, a motor 240, a lens 250, an optical fiber 260 and a radiation detector 270. The rod 210 is inserted into a cylindrical through hole 115 formed in the bottom part 114 of the process chamber 110.

In the present embodiment, the rod 210 is made of sapphire or quartz. Sapphire or Quartz is used because of its good heat resistance and good optical characteristic as described later. However, the rod 210 is not limited to the sapphire or quartz. Since the rod 210 has a good heat resistance, there is no need to provide a cooling arrangement to cool the rod 210, which contributes miniaturization of the apparatus 100.

The rod 210 may be projected by a predetermined distance toward an interior of the process chamber 110, if necessary. Rod 210 is inserted into the through hole 115 provided in the bottom part 114 of the process chamber 110, and sealed by an O-ring 190. Thereby, the process chamber 110 can be maintained at a negative pressure although the through hole 115 is formed in the bottom part 114 of the process chamber 110.

The rod 210 can contain the heat radiation light incident thereon, and guides the heat radiation light to the casing 230 with less attenuation. Accordingly, the rod 210 has a superior light gathering efficiency. Additionally, the rod 210 enables a multiple reflection of the radiation light between a high-reflectance surface 232 of the chopper 230 and the target object W. The temperature of the target object W can be accurately measured by positioning the rod 210 close to the target object W.

The rod 210 enables separation of the casing 220 from the target object W. Thus, the rod 210 can omit a cooling arrangement to cool the casing 220, and contributes to miniaturization of the apparatus 100. If the cooling arrangement to cool the casing 220 is provided, the rod 210 can minimize a power supplied to the cooling arrangement of the rod 210.

The rod 210 according to the present embodiment can be made of quartz or sapphire with a multi-core optical fiber. In such a case, the multi-core optical fiber is provided between the quartz or sapphire rod and the chopper 230. Thereby, the rod 210 is provided with flexibility, which increases a freedom in positioning the radiation thermometer 200. Additionally, since a main body or the casing 220 of the radiation thermometer 200 can be separated from the target object W, each part of the radiation thermometer 200 is prevented from being deformed to influence of the temperature of the target object W, thereby maintaining an accurate measurement of the temperature of the target object W.

The casing 220 has a substantially cylindrical shape, and is provided on the bottom part 114 so as to cover the through hole 115.

The chopper 230 has a disk-like shape, and is positioned vertically so that a part of the chopper 230 is positioned under the through hole 115 within the casing 220. The chopper 230 is connected to a rotation axis of the motor 240 at the center thereof so as to be rotated by the motor 240. The surface of the chopper 230 is divided into four equal parts including two high-reflectance surfaces 232 and two low-reflectance surfaces 234. The surfaces 232 and 234 are alternatively arranged, and each of the surfaces 232 and 234 has a slit 231. The high-reflectance surfaces 232 are formed, for example, by aluminum or gold plating. The low-reflectance surfaces 234 are formed, for example, by black painting. Each of the high-reflectance surfaces 232 has a measurement area 232a corresponding to the slit 231 and a measurement area 232b other than the slit 231. Similarly, each of the low-reflectance surfaces 234 has a measurement area 234a corresponding to the slit 231 and a measurement area 234b other than the slit 231.

The chopper 230 may have a structure other than the structure shown in FIG. 14. For example, the chopper may have a semicircular high-reflectance surface with the slit 231. Alternatively, the chopper may be divided into four or six equal parts with the high-reflectance surface with the slits 231 and notch portions arranged alternately. The slit may 231 be provided only to the high-reflectance surfaces.

When the chopper 230 is rotated by the motor 240, the high-reflectance surface 232 and the low-reflectance surface 234 alternately appear under the rod 210. When the high-reflectance surface 232 is positioned under the rod 210, a large par of the light propagated through the rod 210 is reflected by the high-reflectance surface 232, and propagates again through the rod 210 and projected onto the target object W. On the other hand, when the low-reflectance surface 234 is positioned under the rod 210, a large part of the light propagates through the rod 210 is absorbed by the low-reflectance surface 234. Thus, a very small amount of light is reflected by the low-reflectance surface 234. The slits 231 guide the radiation light from the target object W or multi-reflected light to the detector 270.

The detector 270 comprises an image forming lens (not shown in the figure), Si-photocell and amplification circuit. The radiation light incident on the image forming lens is supplied to the control unit 300 after converting into an electric signal representing radiation intensities $E_1(T)$ and $E_2(T)$ as described later. The control unit 300 has a CPU and a memory so as to calculate the emissivity $\epsilon$ and the temperature T of the target object W in accordance with the radiation intensities $E_1(T)$ and $E_2(T)$. It should be noted that the calculation can be performed by an arithmetic unit (not shown in the figure) of the radiation thermometer 200.

More specifically, the light passed through the slit 231 is gathered by the lens 250, and is transmitted to the detector 270 by the optical fiber 260. The radiation intensities at the high-reflectance surface 232 and the low-reflectance surface 234 are represented by the following equations (2) and (4), respectively.

$$E_1(T)=\epsilon E_{BB}(T)/[1-R(1-\epsilon)] \qquad (2)$$

Where, $E_1(T)$ is a radiation intensity of the high-reflectance surface 232 at the temperature T obtained by the detector 270; R is an effective reflectance of the high-reflectance surface 232; $\epsilon$ is a reflectance of the target object W; and $E_{BB}(T)$ is a radiation intensity of a black body at the temperature T. The equation (2) is obtained by the following equation (3). It is assumed that the target object W had no heat radiation.

$$E_1(T)=\epsilon E_{BB}(T)+\epsilon R(1-\epsilon)E_{BB}(T)+\epsilon[R(1-\epsilon)]2+\ldots\infty=\epsilon E_{BB}(T)/[1-R(1-\epsilon)] \qquad (3)$$

$$E_2(T)=\epsilon E_{BB}(T) \qquad (4)$$

Where, $E_2(T)$ is a radiation intensity of the low-reflectance surface 234 at the temperature T obtained by the detector 270. The equation (49 is obtained from the prank Planck's law. The emmisivity $\epsilon$ is represented by the following equation (5).

$$\epsilon=[E_2(T)/E_1(T)+R-1]/R \qquad (5)$$

Generally, spectral concentration of a radiant emittance of an electromagnetic wave radiated by a black body can be given by the prank Planck's law. When the radiation thermometer 200 measures a temperature of a black body, the relationship between the temperature T of the black body and the radiation intensity $E_{BB}(T)$ can be represented by the following equation (6) and (7) by using constants A, B and C which are determined by an optical system of the radiation thermometer 200.

$$E_{BB}(T)=C\exp[-C_2/(AT30B)] \qquad (6)$$

$$T=C_2/A[\ln C-\ln E_{BB}(T)]R/A \qquad (7)$$

Where, $C_2$ is a second constant of radiation.

The detector 270 or the control unit 300 can obtain the radiation intensity $E_{BB}(T)$, and thereby the temperature T can be obtained by entering the radiation intensity $E_{BB}(T)$ in the equation (7). Thus, the control unit 300 can obtain the temperature T of the target object W.

Figure 15:
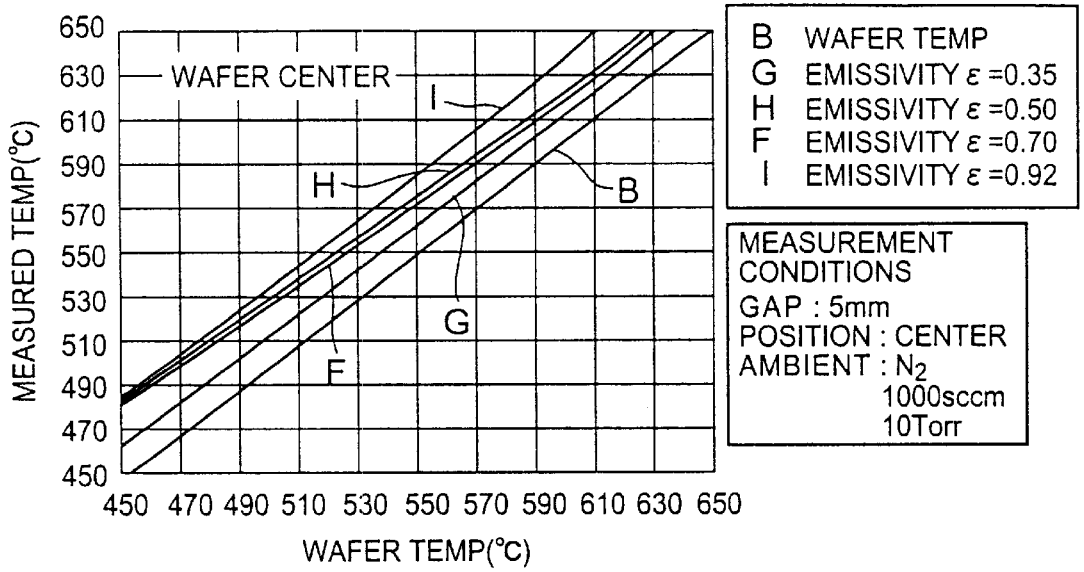
FIG. 15 is a graph showing a relationship between a temperature of the target object and a temperature of the center of the target object.
Figure 16:
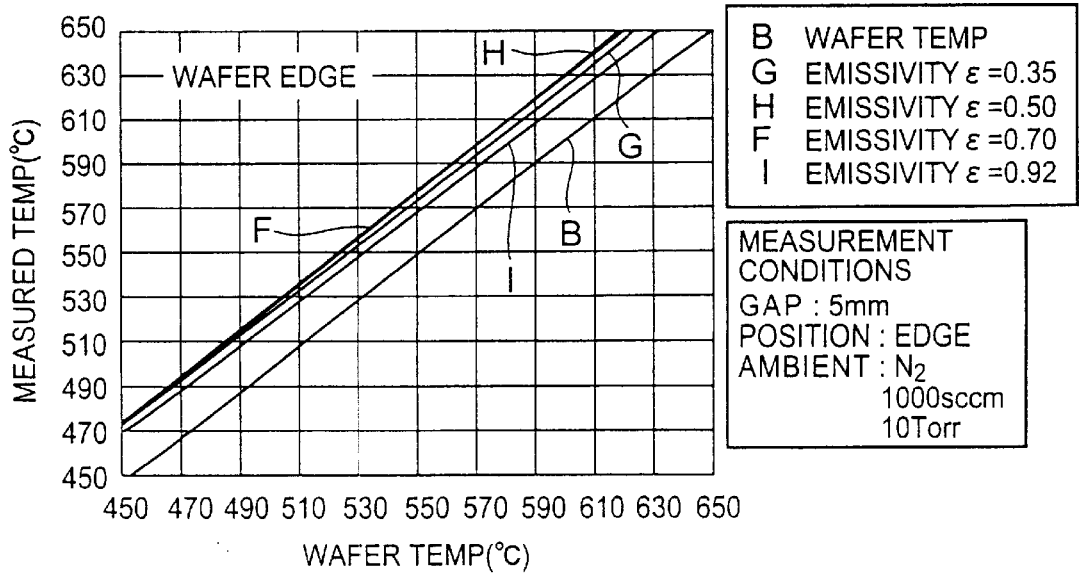
FIG. 16 is a graph showing a relationship between a temperature of the target object and a temperature of an edge of the target object.

However, in practice, the temperature obtained by the equation (7) includes an error of about 20° C. to 40° C., as shown in FIGS. 15 and 16, in comparison with the real temperature of the target object W. FIG. 15 is a graph showing a relationship between a temperature of the target object W and a temperature of the center of the target object W obtained by the radiation thermometer 200 using the equation (1). FIG. 16 is a graph showing a relationship between a temperature of the target object W and a temperature of an edge of the target object W obtained by the radiation thermometer 200 using the equation (1).

Figure 17:
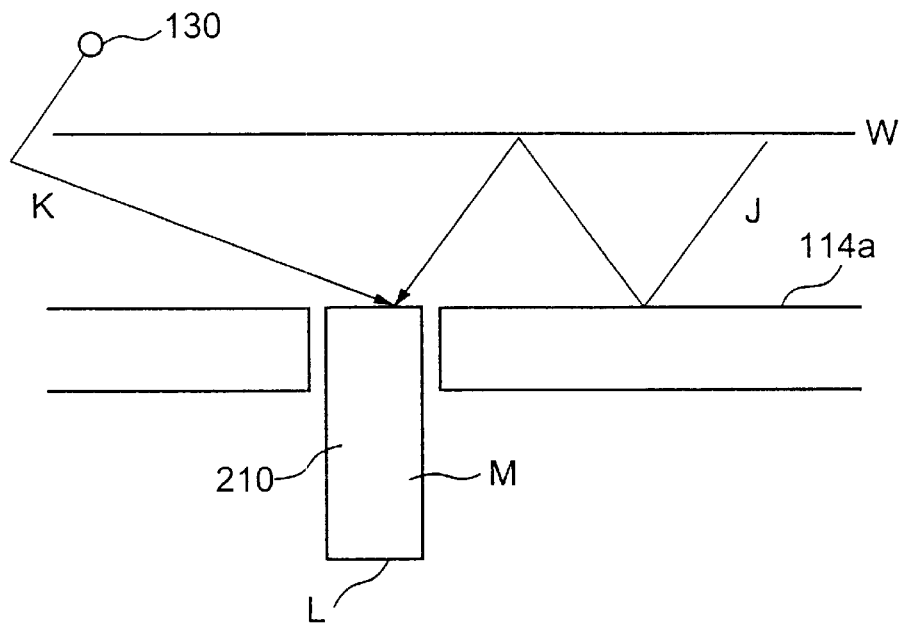
FIG. 17 is an illustrative cross-sectional view for explaining errors contained in the measurement of the temperature of the target object.

The inventors of the present invention considered the reason for the error, and found that some errors must be taken into consideration when the equation (1) is used for measuring the temperature of the target object W. Additionally, as shown in FIG. 17, the errors include: 1) a multi-reflected light J which is radiated by the target object W and reflected by the surface 114a; 2) a light K radiated by the target object W; 3) a transmission loss L due to reflection at an edge of the rod 210; and 4) an absorption loss M of the rod 210. The light J and the light K may be referred to as stray light. The stray light provided large influence to the measurement error especially in the single wafer process chamber 110 in which a reflectance of an inner surface of the process chamber 110 and parts surrounding the target object W is set high so as to increase a thermal efficiency. FIG. 17 is an illustrative cross-sectional view for explaining errors contained in the measurement of the temperature of the target object which measurement is obtained by using the equation (1).

In order to compensate for the errors, the inventors of the present invention changed the equation (1) to equation (8).

$$E_m(T)=G\{[\epsilon/[(1\alpha(1-\epsilon))-\beta]\}\{E_{BB}(T)+S) \qquad (8)$$

In the equation (8), the error 1) caused by the multi-reflected light J is corrected by $\epsilon/[(1-\alpha(1\epsilon))$ ; the error 2) caused by the light K radiated by the target object W is corrected by S; the error 3) caused by the transmission loss L due to reflection at an edge of the rod and the fiber is corrected by $\beta$; and the error 4) caused by the absorption loss M is corrected by G (gain). It should be noted that the result of temperature calculation based on the equation (1) can be approximated by adopting not all but at least one of the above-mentioned corrections. The temperature measurement calculation program using the equation (8) or the equation (8) adopting at least one of the corrections may be stored in a computer readable medium such as a floppy disk or a CD-ROM. Alternatively, the program can be distributed through a communication network such as the Internet.

Figure 18:
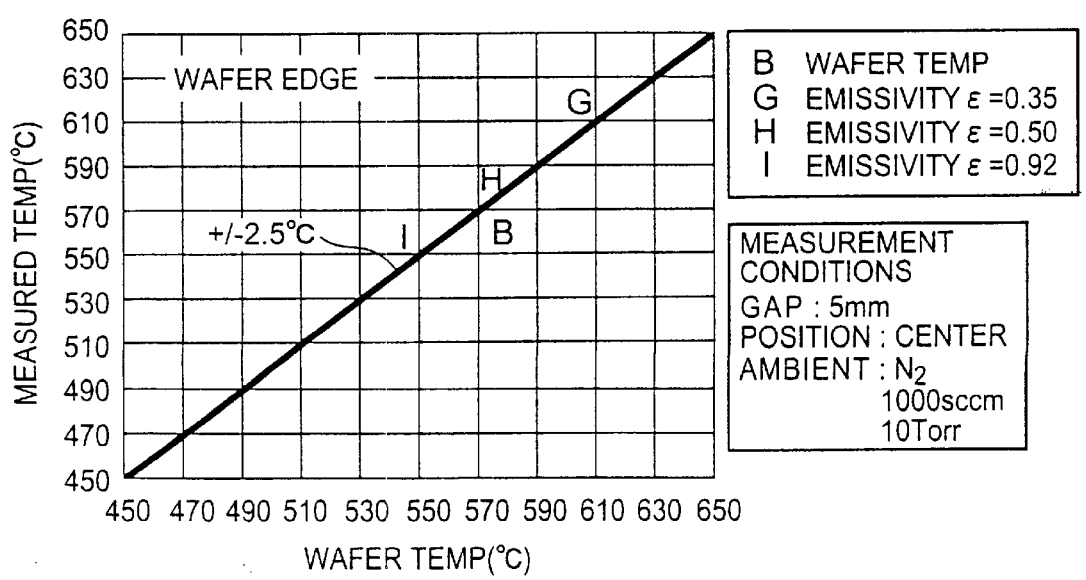
FIG. 18 is a graph showing a relationship between a real temperature of the target object and a temperature of the center of the target object obtained by the radiation thermometer shown in FIG. 1.
Figure 19:
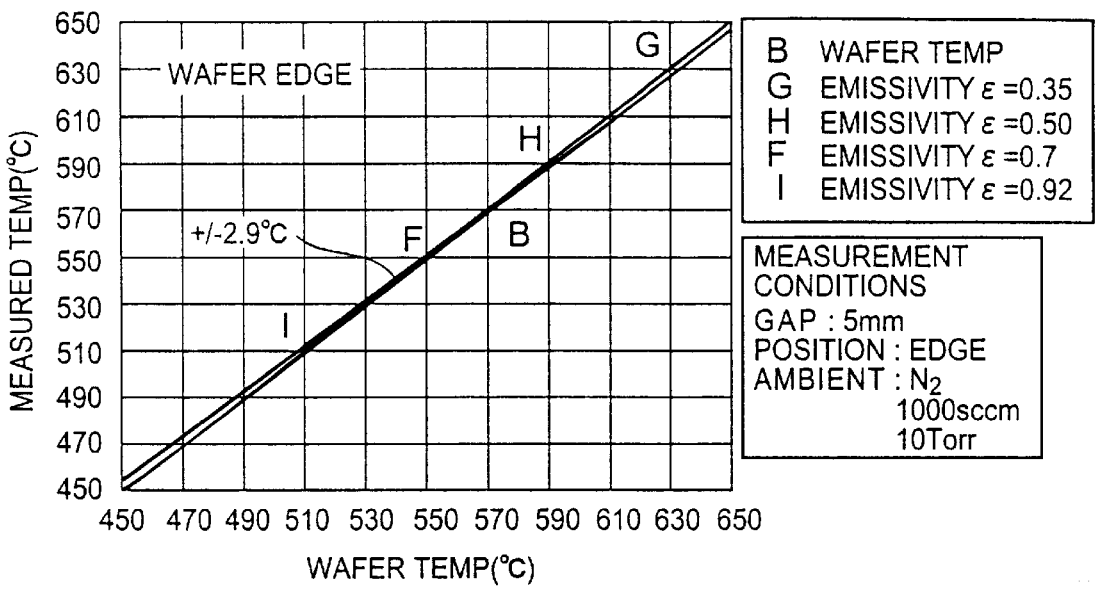
FIG. 19 is a graph showing a relationship between a real temperature of the target object and a temperature of an edge the target object obtained by the radiation thermometer shown in FIG. 1.

FIGS. 18 and 19 show graphs in which a temperature measured by using the equation (8) is compared with a real temperature of target object W. More specifically, FIG. 18 is a graph showing a relationship between the real temperature of the target object W and the temperature of the center of the target object W obtained by the radiation thermometer 200 using the equation (8). FIG. 19 is a graph showing a relationship between the real temperature of the target object W and the temperature of an edge the target object W obtained by the radiation thermometer 200 using the equation (8). It can be interpreted from FIGS. 18 and 19 that the difference between the real temperature and the temperature measured by the radiation thermometer 200 using the equation (8) can be maintained within a range of $\pm 3°$ C.

The control unit 300 is provided with a CPU and a memory inside thereof so as to feedback-control the output of the lamps 130 by detecting the temperature T of the target object W and controlling the lamp driver 310. Additionally, the control unit 300 sends a drive signal to the motor driver 320 at a predetermined timing so as to control a rotation speed of the target object W.

The gas introducing part 180 includes, for example, a gas supply source (not shown in the figure), a flow adjust valve, a mass-flow controller, a gas supply nozzle and a gas supply passage connecting the aforementioned parts. The gas introducing part 180 introduces a process gas used for heat treatment into process chamber 110. It should be noted that although the gas introducing part 180 is provided to the sidewall 112 of the process chamber 110 in the present embodiment, the position of the gas introducing part 180 is not limited to the side of the process chamber 110. For example, the gas introducing part 180 may be constituted as a showerhead, which introduces a process gas from an upper portion of the process chamber 110.

If annealing is performed, $N_2$ or Ar may be used as the process gas. If nitriding is performed, $N_2$ or $NH_3$ may be used. Additionally, if a film deposition is performed, $NH_3$, $SiH_2CL_2$ or $SiH_4$ may be used. However, the process gas is not limited to the aforementioned gases. The mass-flow controller controls a flow rate of the process gas. The mass-flow controller comprises, for example, a bridged circuit, an amplification circuit, a comparator control circuit, a flow adjust valve, etc. The mass-flow controller measures a flow rate by detecting a heat transfer form an upstream to a downstream of the gas flow so as to control the flow adjust valve. The gas supply passage may be made of a seamless pipe and a bite type coupling or a metal gasket coupling is used so as to prevent impurities from entering the process gas to be supplied through the gas supply passage. Additionally, in order to prevent generation of dust particles due to dirt or corrosion of an interior of the pipe, the pipe is made of a corrosion resistant material or the inner wall of the pipe is covered by an insulating material such as PTFE (Teflon), PFA, polyimide, PBI or the like. Additionally, an electro polishing may be applied to the inner wall. Further, a dust particle trap filter may be provided to the gas introducing part 180.

The exhaust part 190 is provided substantially parallel to the gas introducing part 180 in the present embodiment. However, the position and the number of the exhaust parts 190 are not limited to such an arrangement. A desired vacuum pump such as a turbomolecular pump, a sputter-ion pump, a getter pump, a sorption pump or a cryostat pump is connected to the exhaust part 190 together with a pressure adjust pump. It should be noted that the process chamber 110 is maintained at a negative pressure in the present embodiment, the present invention does not always require such a negative pressure environment. For example, the present invention may be applicable to an apparatus, which perform a process under a pressure ranging from 133 Pa to an atmospheric pressure. As described later with reference to FIGS. 21 through 25, the exhaust part 190 also has a function to evacuate helium gas before a subsequent process is started.

Figure 20:
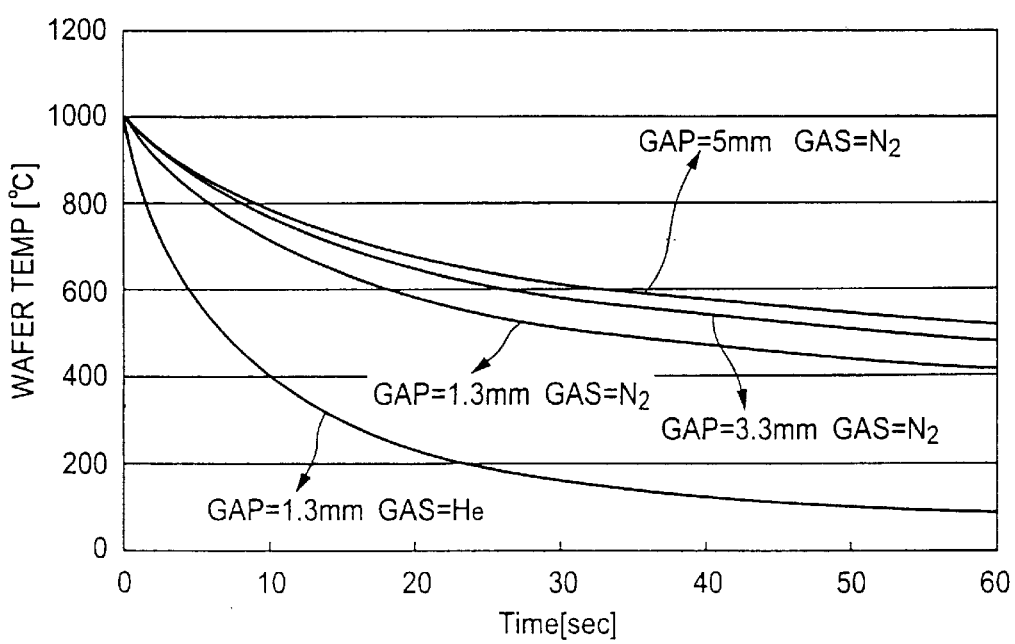
FIG. 20 is a graph showing a result of simulation with respect to a cooling rate of the target object.

FIG. 20 is a graph showing a result of simulation with respect to a cooling rate of the target object W. In FIG. 20, a gap means a distance between the target object W and the bottom part 114 of the process chamber 110. It can be appreciated from FIG. 20 that: 1) the cooling rate increases as the gap decreases; and 2) the cooling rate remarkably increases by supplying helium gas having a high-thermal conductivity to a space between the target object W and the bottom part 114.

In the structure of the RTP apparatus 100 shown in FIG. 1, an upper surface of the target object W is heated by the lamps 130 and the bottom part 114 serving as a cooling plate faces a lower surface of the target object W. Accordingly, the structure shown in FIG. 1 has a high cooling rate, but requires a large power to rapidly increase the temperature of the target object W since the heat radiated from the target object W is large. In order to decrease the heat radiation from the target object W, the supply of the cooling water 116 to the cooling pipe 116 may be stopped. However, this method is not preferable since a total process time is increased, which decreases yield rate.

Figure 21:
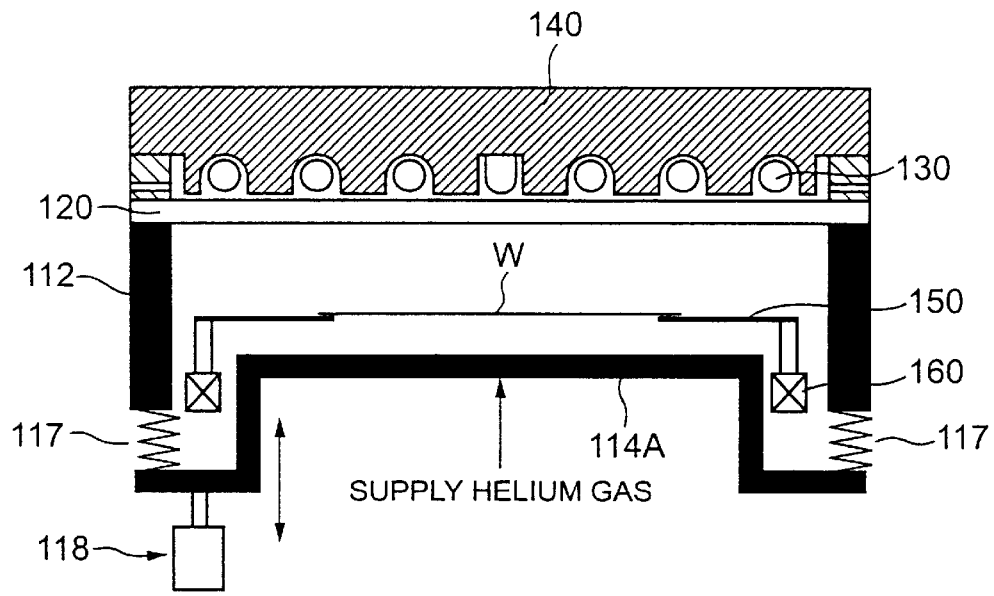
FIG. 21 is an illustrative cross-sectional view of a thermal processing apparatus having a bottom part that is movable relative to the target object.
Figure 22:
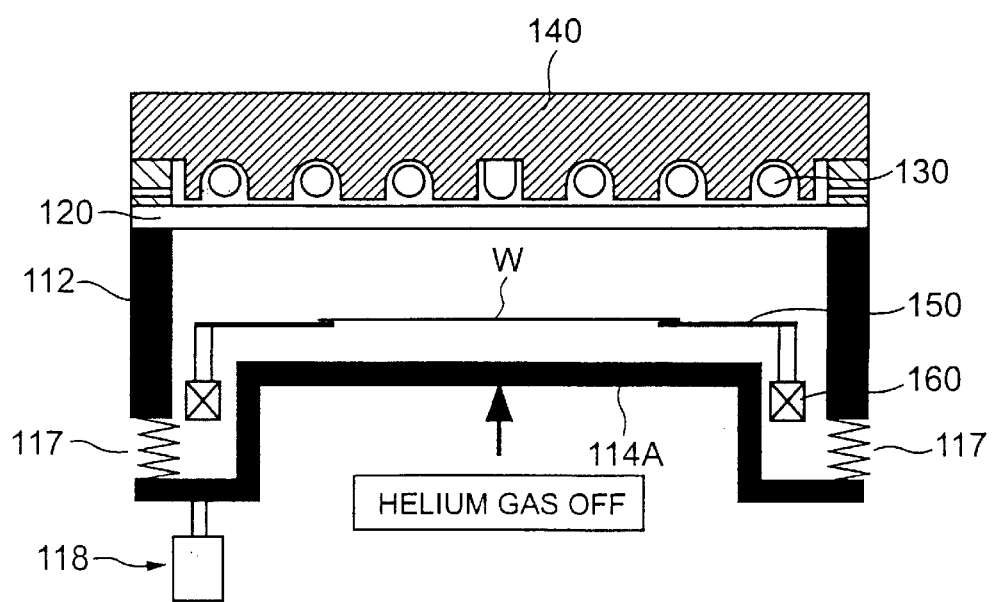
FIG. 22 is an illustrative cross-sectional view of the thermal processing apparatus shown in FIG. 21 for explaining a positional relationship between the target object and the bottom part when the target object is subject to a heating process.
Figure 23:
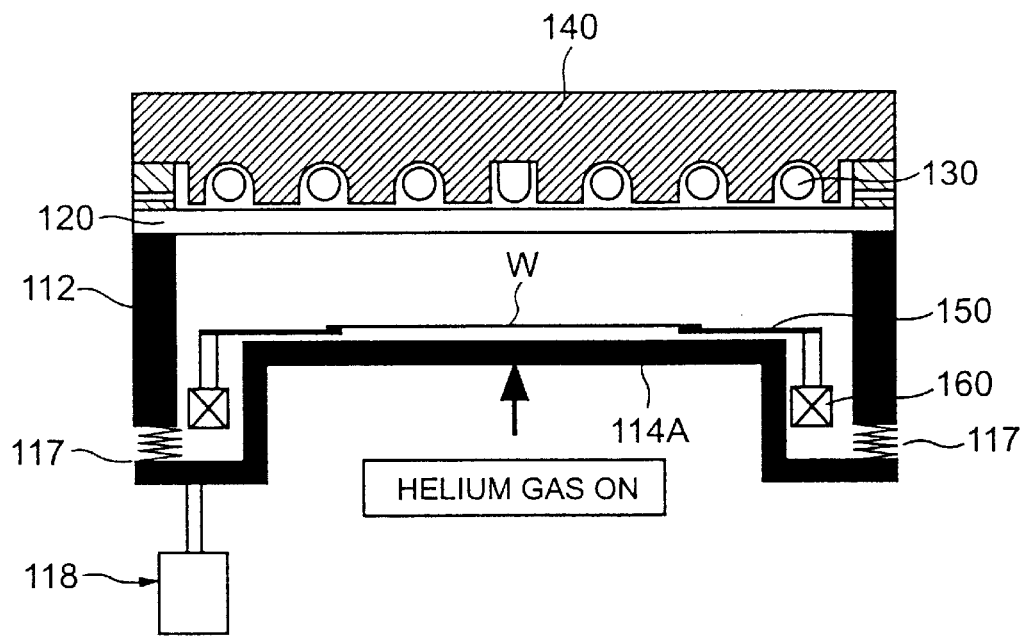
FIG. 23 is an illustrative cross-sectional view of the thermal processing apparatus shown in FIG. 21 for explaining a positional relationship between the target object and the bottom part when the target object is subject to a cooling process.

Accordingly, as shown in FIGS. 21 through 23, the bottom plate 114 serving as a cooling plate may be replaced by a bottom part 114A, which is movable relative to the target object W. More preferably, helium gas having a high thermal conductivity is supplied to a space between the target object W and the bottom part 114A so as to increase a cooling efficiency. FIG. 21 is an illustrative cross-sectional view of the thermal processing apparatus having the bottom part 114A that is movable relative to the target object W. FIG. 22 is an illustrative cross-sectional view of the thermal processing apparatus shown in FIG. 21 for explaining a positional relationship between the target object W and the bottom part 114A when the target object W is subject to a heating process. FIG. 23 is an illustrative cross-sectional view of the thermal processing apparatus shown in FIG. 21 for explaining a positional relationship between the target object W and the bottom part 114A when the target object W is subject to a cooling process. It should be noted that in FIGS. 21 through 23, the radiation thermometer 200 and the cooling pipe 116 are omitted for the sake of simplification of the figure.

As shown in FIG. 21, the bottom part 114A is vertically movable relative to the target object W. A bellows 117 is provided between the sidewall 112 of the process chamber 110 and the bottom part 114A so that a negative pressure can be maintained in the process chamber 110. The bottom part 114A is vertically moved by a vertical moving mechanism 118, which can be any conventional moving mechanism. It should be noted that the, instead of moving the bottom part 114A, the target object W or the support ring 150 may be moved relative to the bottom part 114A. When eating the target object W, the bottom part 114A is moved away from the target object W, as shown in FIG. 22, and the supply of helium gas is stopped. At this time, a distance between the target object W and the bottom part 114A is, fro example, 10 mm. Since the distance between the target object W and the bottom part 114A is large, the target object W hardly receives an influence of the bottom part 114A, thereby enabling a rapid temperature rise. The position of the bottom part 114A shown in FIG. 22 is set as a home position.

Figure 24:
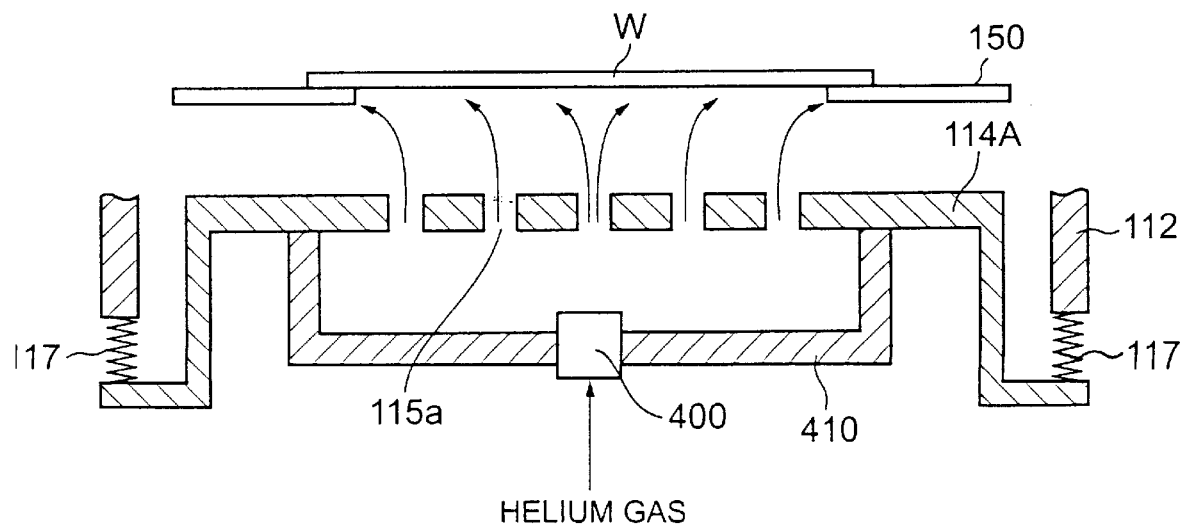
FIG. 24 is an illustrative enlarged cross-sectional view of the bottom part shown in FIG. 23 for explaining the supply of helium gas.

When cooling the target object W, the bottom part 114A is vertically moved toward the target object W and the supply of helium gas is started, as shown in FIG. 23. Since the distance between the bottom part 114A and the target object W is small, the target object receives an influence of the bottom part 114A, thereby enabling a rapid cooling process. In this state, the distance between the target object W and the bottom part 114A is, for example, 1 mm. FIG. 24 is an illustrative enlarged cross-sectional view of the bottom part 114A for explaining the supply of helium gas. As shown in FIG. 24, The bottom part 114A is provided with many small holes 115a and a case 410 is mounted to the bottom surface of the bottom part 114A so as to introduce the helium gas into a space between the target object W and the bottom part 114A. A case 410 is provided with a valve 400 which is connected to a helium gas supply pipe (not shown in the figure).

Although the present embodiment is directed to a relative movement of the bottom part (cooling plate) 114A and the target object W, the present invention is applicable to a relative movement between the lamps 130 and the target object W.

A description will now be given, with reference to FIG. 1, of a rotating mechanism for rotating the target object W. In order to maintain a good electric performance and a high yield rate of the integrated circuit elements formed on the target object W, it is required to perform a uniform heat treatment over an entire surface of the target object W. If the temperature distribution of the target object W is uneven, a thickness of a film deposited on the target object W may not be uniform, or a slip may occur in the silicon crystal due to a thermal stress. Accordingly, the RTP apparatus 100 cannot provide a high-quality thermal process. Such an uneven temperature distribution may be caused by an uneven distribution of irradiation by the lamps 130, or caused by a removal of heat from the surface of the target object W by the process gas introduces into a space near the gas introducing part 180. The rotating mechanism allows the target object W to be uniformly heated by the lamps 130 by horizontally rotating the target object W.

The rotating mechanism of the target object W comprises a support ring 150, an annular permanent magnet 170, an annular magnetic member 172, a motor driver 320 and a motor 330.

The support ring 150 is made of, for example, a ceramic material having a heat resistance such as SiC. The support ring 150 serves as a stage on which the target object W is placed. The support ring 150 may have an electrostatic chuck or a clamp mechanism so as to fix the target object W thereto. The support ring 150 prevents deterioration of the uniform heating due to heat released from an edge of the target object W.

An outer periphery of the support ring 150 is connected to a support part 152. If necessary, a thermal insulating member such as a quartz glass is interposed between the support ring 150 and the support part 152 so as to thermally protect the magnetic member 172. The support part 152 of the present embodiment is constituted by an opaque quartz member having a hollow cylindrical shape. A bearing 160 is fixed to the support member 152 and the inner wall 112 of the process chamber 110 so as to enable the support member 152 to rotate while the process chamber 110 is maintained at a negative pressure. The magnetic member 172 is provided on an end of the support part 152.

The annular permanent magnet 170 and the magnetic member 172 are magnetically coupled, and the permanent magnet is rotated by the motor 330. The motor 330 is driven by the motor driver 320, which is controlled by the control unit 300.

As a result, when the permanent magnet is rotated, the magnetically coupled magnetic member 172 rotates together with the support part 152, thereby rotating the support ring 150 and the target object W. The rotation speed is 90 RPM in this embodiment. However, the rotation speed may be determined based on the material and size of the target object W or a kind or temperature of the process gas so that a uniform temperature distribution is achieved in the target object W and a turbulent flow of the gas in the process chamber 110 is prevented. The permanent magnet 170 and the magnetic member 172 can be reversed as long as they are magnetically coupled, or both members may be magnets.

A description will now be given of an operation of the RTP apparatus. A transport arm of a cluster tool (not shown in the figure) carry the target object W in the process chamber 110 through a gate valve (not shown in the figure). When the transport arm supporting the target object W reaches a position directly above the support ring 150, a lifter pin vertically moving system (not shown in the figure) moves lifter pins (for example, three pins) so as to support the target object W thereon. As a result, the support of the target object W is shifted from the transport arm to the lifter pins. Thus, the transport arm returns through the gate valve. Thereafter, the gate valve is closed, and the transport arm may move to the home position.

On the other hand, the lifter pin vertically moving system returns the lifter pins below the support ring 150 so that the target object W is placed on the support ring 150. The lifter pin vertically moving system uses a bellows (not shown in the figure) so as to maintain the process chamber at a negative pressure while the lifter pins are vertically moved and prevent the atmosphere inside the process chamber 110 from flowing out of the process chamber 110.

Thereafter, the control unit 300 controls the lamp driver 310 to drive the lamps 130. In response, the lamp driver 310 drives the lamps 130 so as to heat the target object W at 800° C. for example. A heat radiation of the lamps 130 passes through the quartz window 120 and is irradiated onto the upper surface of the target object W so as to rapidly raise the temperature of the target object W at a heating rate of about 200° C./sec. Generally, a peripheral portion of the target object W releases a larger amount of heat than the center portion thereof. Thus, the lamps 130 according to the present embodiment are concentrically arranged, which enables a local control of the power provided to the lamps 130, so as to provide a sharp directivity and temperature controllability. If the apparatus 100 uses the structure shown in FIG. 20, the bottom part 114A is at the home position as shown in FIG. 21. Since the target object W is distant from the bottom part 114A (cooling plate) in the structure shown in FIG. 21, the target object W is hardly influenced by the bottom part 114A, thereby achieving an efficient heating. At the same time or the exhaust part 190 maintains a negative pressure in the process chamber 110 at the same time or before of after the heating process is performed.

At the same time, the control unit 300 controls the motor driver 320 to drive the motor 330. In response, the motor driver 320 drives the motor 330 so as to rotate the annular permanent magnet 170. As a result, the support part 152 is rotated, and the target object W rotates together with the support ring 150. Since the target object W rotates, the temperature of the target object can be maintained uniform.

The quartz window provides some advantages when the heating process is being performed since the quartz plate 121 of the quartz window 120 is relatively thin. The advantages are: 1) an irradiation efficiency to the target object W is not deteriorated since the quartz window absorbs less heat; 2) thermal stress destruction hardly occurs since the temperature difference between the front and back surfaces of the quartz plate 121 is small; 3) a deposition film or a by-product hardly adheres on the surface of the quartz plate 121 since the temperature rise of the quartz plate 121 is small; and 4) a difference between a negative pressure and in the process chamber 110 and the atmospheric pressure can be maintained even if the thickness of the quartz plate 121 is small since the ribs 122 increase the strength of the quartz window 120. Additionally, if the ribs 122 of the quartz window 120 are inserted into the respective grooves 146 of the reflector 140A as shown in FIG. 6, 5) the quartz plate 121 and the ribs 122 are prevented from being broken due to a thermal stress since the temperature rise in the ribs 122 is small, and 6) a withstand characteristic is improved with respect to the pressure difference between the negative pressure in the process chamber 110 and the atmospheric pressure.

The temperature of the target object W is measured by the radiation thermometer 200, and the control unit 300 feedback-controls the lamp driver 310 based on the result of the measurement. Since the target object W is rotated, the uniform temperature distribution is expected in the target object W. However, if desired, the radiation thermometer 200 can measure temperatures of a plurality of positions (for example, the center and periphery) of the target object W. Thus, if the measurement indicates that the temperature distribution is not uniform, the control unit 300 may instruct to locally change the output of the lamps 130.

The main body of the radiation thermometer 200 hardly receives an influence of the target object W since the radiation thermometer 200 has the rod 210, which separates the chopper 230 from the target object W. Thereby, the radiation thermometer 200 has a high accuracy of measurement. Additionally, the cooling arrangement of the main body of the radiation thermometer 200 can be omitted or minimized, which contributes to miniaturization and improvement in economical efficiency of the apparatus 100. When he target object w is maintained under a high-temperature environment for a long time, the electric property of the integrated circuit formed on the target object W is deteriorated. Accordingly, the temperature control of the target object W is indispensable so as to achieve a rapid heating and rapid cooling. The radiation thermometer 200 satisfies such a requirement. Especially, since the calculation of temperature of the target object W by the radiation thermometer 200 or the control unit 300 using the equation (8) maintains the error within a range of ±3° C., the RTP apparatus 100 can provide a high-quality thermal treatment.

After the process chamber 110 reaches the predetermined negative pressure environment is formed and the target object W starts to rotate, the flow-controlled process gas is introduced into the process chamber 110 from the gas introducing part (not shown in the figure). Then, after a predetermined heat treatment (for example, 10 seconds) is completed, the control unit 300 controls the lamp driver 310 to stop the drive of the lamps 130. In response, the lamp driver 310 stops the supply of the power to the lamps 130. If the apparatus 100 uses the structure shown in FIG. 21, the control unit 300 controls the vertically moving mechanism 118 to move the bottom part 114A to the cooling position shown in FIG. 23. preferably, helium gas, which has a high conductivity, is introduced into a space between the target object W and the bottom part 114A as shown in FIG. 24. Thereby, A cooling efficiency of the target object W is improved, and a rapid cooling can be achieved with a relatively low power consumption. The cooling rate is, for example, 200° C./sec.

After completion of the heat treatment, the target object W is carried out of the process chamber 110 through the gate valve by the transport arm performing the above-mentioned operations in reverse order. Thereafter, if necessary, the transport arm carries the target object W to an apparatus of the next stage such as a film deposition apparatus.

The present invention is not limited to the specifically disclosed embodiments, and variations and modifications may be made without departing from the scope of the present invention.

The present application is based on Japanese priority application No. 2000-121575 filed Apr. 21, 2000, the entire contents of which are hereby incorporated by reference.

What is claimed is:

1. A quartz window of a process chamber adapted to be positioned between a radiation heat source and an object to be subjected to a heat treatment in the process chamber, the quartz window comprising:

a plate made of quartz; and a plurality of ribs formed on said plate so as to reinforce said plate.

2. The quartz window as claimed in claim 1, wherein said ribs are made of quartz.

3. The quartz window as claimed in claim 2, wherein said ribs are integrally formed with said plate.

4. The quartz window as claimed in claim 1, wherein said ribs include a plurality of radial ribs extending in radial directions of said plate.

5. The quartz window as claimed in claim 4, wherein said radial ribs are symmetrically arranged with respect to the center of said plate.

6. The quartz window as claimed in claim 1, wherein said ribs include a plurality of circumferential ribs extending in circumferential directions of said plate.

7. The quartz window as claimed in claim 6 wherein said circumferential ribs are concentrically arranged.

8. The quartz window as claimed in claim 1, wherein said plate has a thickness equal to or smaller than 10 mm.

9. The quartz window as claimed in claim 1, wherein each of said ribs has a thickness equal to or less than 10 mm.

10. The quartz window as claimed in claim 1, wherein each of said ribs has a height equal to or less than 15 mm.

11. The quartz window as claimed in claim 1, wherein said ribs have openings to let air pass therethrough.

12. A thermal processing apparatus comprising:

a process chamber in which an object to be processed is placed;

an exhaust part connected to said process chamber so as to evacuate gas inside said process chamber;

radiation heat sources which apply heat to said object placed in said process chamber; and a quartz window situated between said radiation heat source and said object, wherein said quartz window has a plurality of ribs formed on a quartz plate so as to reinforce the quartz plate.

13. The thermal processing apparatus as claimed in claim 12, wherein said ribs are made of quartz, and said ribs are integrally formed with said plate.

14. The thermal processing apparatus as claimed in claim 12, wherein said ribs include a plurality of radial ribs extending in radial directions of said plate, and said radial ribs are symmetrically arranged with respect to the center of said plate.

15. The thermal processing apparatus as claimed in claim 12, wherein said ribs include a plurality of circumferential ribs extending in circumferential directions of said plate, and said circumferential ribs are concentrically arranged.

16. The thermal processing apparatus as claimed in claim 12, further comprising a reflector which reflects a heat radiated from said radiation heat source toward said object through said quarts window, and said reflector has accommodating parts accommodating said radiation heat source and a plurality of extending parts extending toward said plate of said quartz window, said extending parts being engaged with the respective ribs of said quartz window.

17. The thermal processing apparatus as claimed in claimed 16, wherein each of said extending parts has a groove which receives a respective one of said ribs of said of said quartz window.

18. The thermal processing apparatus as claimed in claim 16, wherein each of said ribs protrudes into a respective one of said accommodating parts so that each of said extending parts of said reflector is positioned between adjacent ones of said ribs.

* * * * *